(12) United States Patent
Lee et al.

(10) Patent No.: US 11,659,712 B2
(45) Date of Patent: May 23, 2023

(54) THREE-DIMENSIONAL SEMICONDUCTOR MEMORY DEVICES

(71) Applicant: Samsung Electronics Co., Ltd., Suwon-si (KR)

(72) Inventors: Taehee Lee, Seoul (KR); Hyunwook Kim, Seoul (KR); Eun-jung Yang, Gunpo-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/712,225

(22) Filed: Apr. 4, 2022

(65) Prior Publication Data

US 2022/0223621 A1 Jul. 14, 2022

Related U.S. Application Data

(63) Continuation of application No. 16/732,518, filed on Jan. 2, 2020, now Pat. No. 11,302,709, which is a (Continued)

(30) Foreign Application Priority Data

Mar. 29, 2018 (KR) ........................ 10-2018-0036678

(51) Int. Cl.
*H01L 27/11582* (2017.01)
*H01L 27/1157* (2017.01)
*H01L 27/11565* (2017.01)

(52) U.S. Cl.
CPC .... *H01L 27/11582* (2013.01); *H01L 27/1157* (2013.01); *H01L 27/11565* (2013.01)

(58) Field of Classification Search
CPC ......... H01L 27/11582; H01L 27/11565; H01L 27/1157
See application file for complete search history.

(56) References Cited

U.S. PATENT DOCUMENTS 8,278,170 B2 10/2012 Lee et al.
8,372,720 B2 2/2013 Fukuzumi et al.
(Continued)

FOREIGN PATENT DOCUMENTS

JP 5142692 B2 2/2013
KR 20120003351 A 1/2012
(Continued)

*Primary Examiner* — Nathan W Ha
(74) *Attorney, Agent, or Firm* — Myers Bigel, P.A.

(57) ABSTRACT

Disclosed are three-dimensional semiconductor memory devices including an electrode structure including gate electrodes stacked in a first direction, a lower pattern group including lower vertical patterns that are in a lower portion of the electrode structure and are connected to the substrate, and an upper pattern group including upper vertical patterns that are in an upper portion of the electrode structure. The upper vertical patterns may be connected to the lower vertical patterns, respectively. The devices may also include two common source plugs spaced apart from each other in a second direction. The electrode structure may be between the two common source plugs. An upper portion of the lower pattern group has a first width in the second direction, an upper portion of the upper pattern group has a second width in the second direction, and the first width may be greater than the second width.

20 Claims, 29 Drawing Sheets

Related U.S. Application Data continuation of application No. 16/149,848, filed on Oct. 2, 2018, now Pat. No. 10,553,610.

(56) References Cited

U.S. PATENT DOCUMENTS

| | | | |
|---|---|---|---|
| 8,394,716 | B2 | 3/2013 | Hwang et al. |
| 8,409,977 | B2 | 4/2013 | Shim et al. |
| 9,576,967 | B1 | 2/2017 | Kimura et al. |
| 9,698,153 | B2 | 7/2017 | Liu et al. |
| 9,768,190 | B2 | 9/2017 | Lee et al. |
| 9,875,929 | B1 | 1/2018 | Shukla et al. |
| 9,972,640 | B1* | 5/2018 | Kai .................. H01L 21/76877 |
| 10,229,927 | B2 | 3/2019 | Lee et al. |
| 10,553,610 | B2 | 2/2020 | Lee et al. |
| 2014/0162420 | A1 | 6/2014 | Oh et al. |
| 2015/0263025 | A1 | 9/2015 | Nakagami |
| 2015/0294977 | A1 | 10/2015 | Kim et al. |
| 2015/0294978 | A1 | 10/2015 | Lu et al. |
| 2015/0318301 | A1 | 11/2015 | Lee et al. |
| 2016/0293621 | A1* | 10/2016 | Huang ............. H01L 27/11582 |
| 2017/0062462 | A1 | 3/2017 | Lee |
| 2017/0179144 | A1* | 6/2017 | Han ................. H01L 27/11568 |
| 2017/0263642 | A1 | 9/2017 | Nishikawa et al. |
| 2018/0019256 | A1* | 1/2018 | Amano ............ H01L 21/76846 |
| 2018/0026049 | A1 | 1/2018 | Lee et al. |
| 2018/0166462 | A1* | 6/2018 | Kim ..................... H01L 23/535 |
| 2018/0277596 | A1* | 9/2018 | Mori ................ H01L 27/11524 |
| 2018/0350879 | A1* | 12/2018 | Sel ....................... H01L 27/249 |
| 2019/0214405 | A1 | 7/2019 | Shirai et al. |

FOREIGN PATENT DOCUMENTS

| | | |
|---|---|---|
| KR | 101559958 B1 | 10/2015 |
| KR | 101698193 B1 | 1/2017 |
| KR | 20170042452 A | 4/2017 |

\* cited by examiner

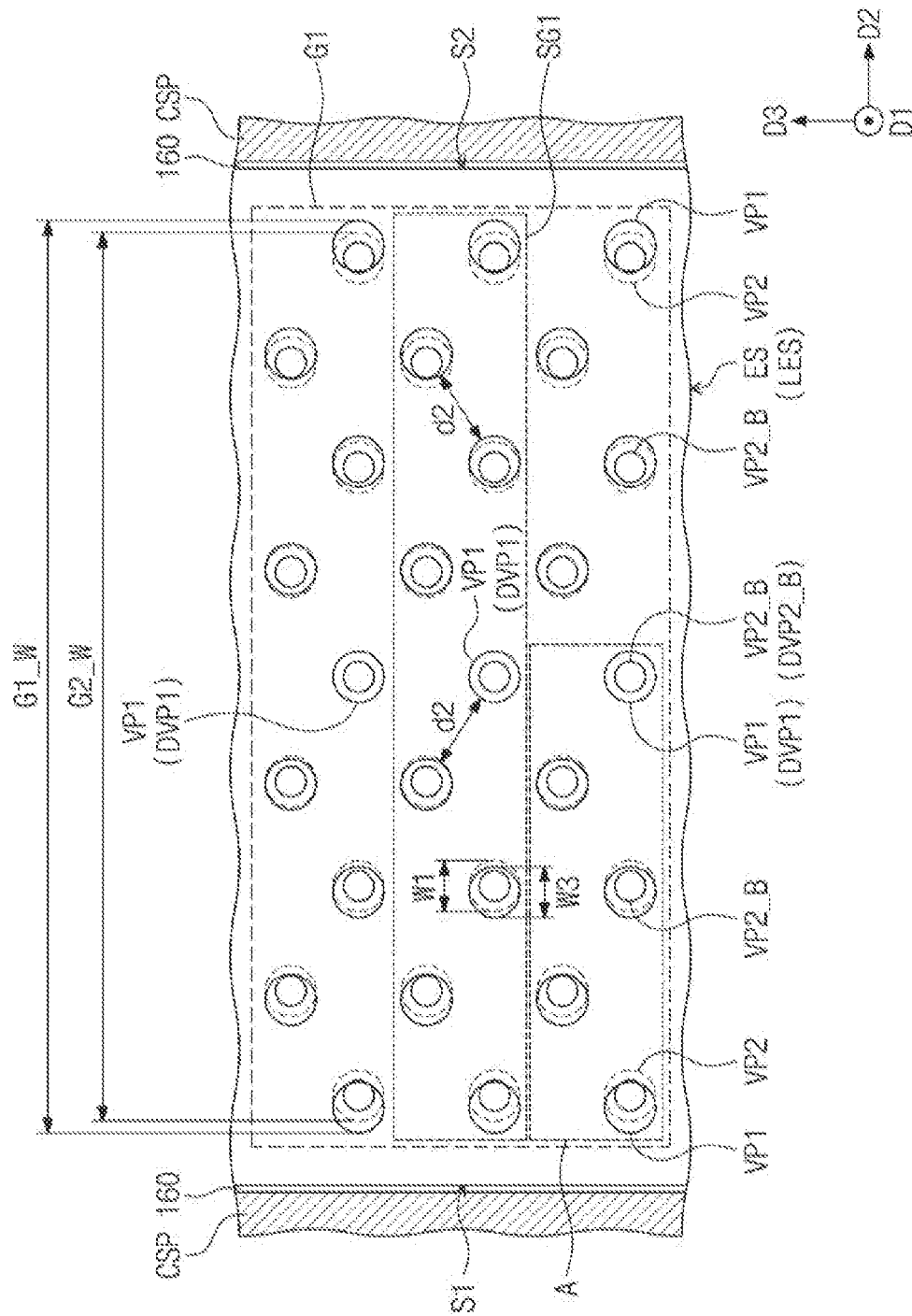

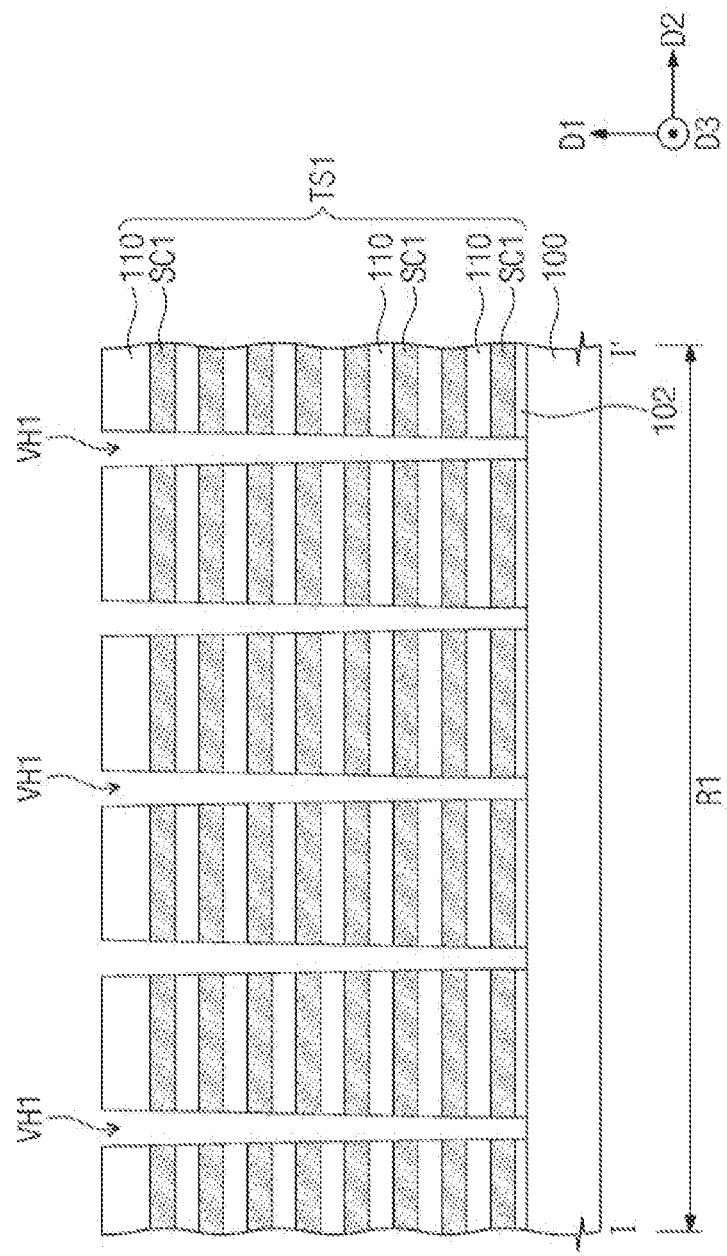

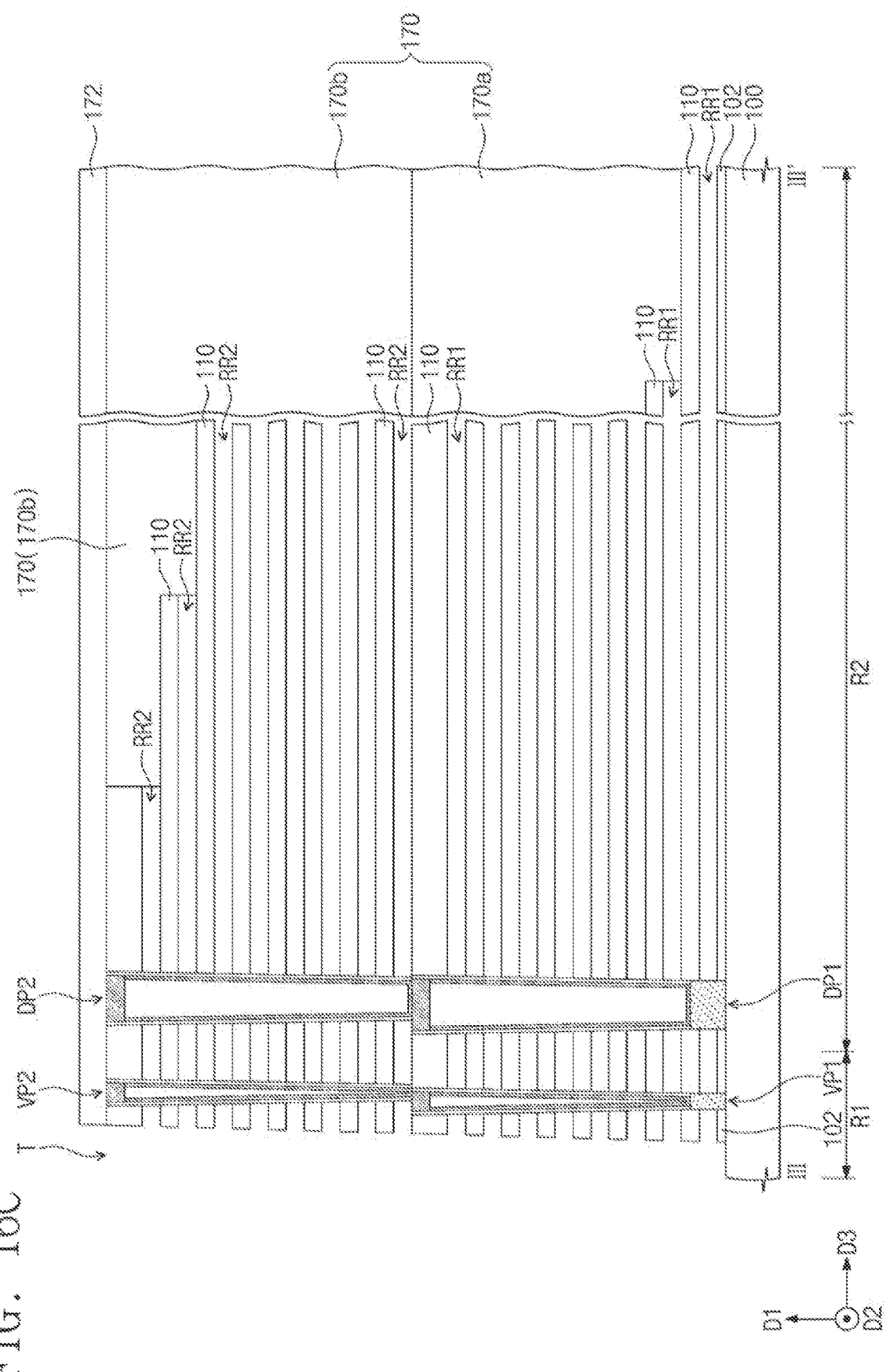

THREE-DIMENSIONAL SEMICONDUCTOR MEMORY DEVICES

CROSS-REFERENCE TO RELATED APPLICATION2

This application is a continuation of U.S. patent application Ser. No. 16/732,518, filed Jan. 2, 2020, which is a continuation of U.S. patent application Ser. No. 16/149,848, filed Oct. 2, 2018, now U.S. Pat. No. 10,553,610, which claims priority under 35 U.S.C § 119 to Korean Patent Application No. 10-2018-0036678, filed on Mar. 29, 2018 in the Korean Intellectual Property Office, the contents of which are hereby incorporated by reference in its entirety.

BACKGROUND

Inventive concepts relate to a semiconductor memory device, and more particularly, to a three-dimensional semiconductor memory device having a plurality of three-dimensionally arranged memory cells.

Semiconductor devices have been highly integrated for satisfying high performance and low manufacturing cost. Since integration of the semiconductor devices is an important factor in determining product price, high integration is increasingly demanded in particular. Integration of typical two-dimensional or planar semiconductor devices is primarily determined by the area occupied by a unit memory cell, such that it is greatly influenced by the level of technology for forming fine patterns. However, the extremely expensive processing equipment needed to increase pattern fineness may set a practical limitation on increasing the integration of the two-dimensional or planar semiconductor devices. To overcome such limitations, three-dimensional semiconductor devices having three-dimensionally arranged memory cells have been proposed.

SUMMARY

Some embodiments of inventive concepts provide a three-dimensional semiconductor memory device having an increased integration.

Some embodiments of inventive concepts provide a three-dimensional semiconductor memory device having an improved structural stability.

According to exemplary embodiments of inventive concepts, three-dimensional semiconductor memory devices may include an electrode structure including a plurality of gate electrodes stacked in a first direction that is perpendicular to a top surface of a substrate, a lower pattern group including a plurality of lower vertical patterns that are in a lower portion of the electrode structure and are connected to the substrate, and an upper pattern group including a plurality of upper vertical patterns that are in an upper portion of the electrode structure. The plurality of upper vertical patterns may be connected to the plurality of lower vertical patterns, respectively. The three-dimensional semiconductor memory devices may also include two common source plugs spaced apart from each other in a second direction that is parallel to the top surface of the substrate. The electrode structure may be between the two common source plugs. An upper portion of the lower pattern group has a first width in the second direction, an upper portion of the upper pattern group has a second width in the second direction, and the first width may be greater than the second width.

According to exemplary embodiments of inventive concepts, three-dimensional semiconductor memory devices may include a substrate including a first region and a second region, an electrode structure on the first region of the substrate and including a plurality of gate electrodes stacked in a first direction that is perpendicular to a top surface of the substrate, and an electrode pad structure extending from the electrode structure toward the second region of the substrate and including a plurality of electrode pads respectively extending from the plurality of gate electrodes. The plurality of electrode pads may form a stepwise structure on the second region. The three-dimensional semiconductor memory devices may also include a lower dummy group including a plurality of lower dummy structures that are in a lower portion of the electrode pad structure and are connected to the substrate and an upper dummy group including a plurality of upper dummy structures that are in an upper portion of the electrode pad structure. The lower dummy group may be between the substrate and the upper dummy group. The three-dimensional semiconductor memory devices may further include two common source plugs spaced apart from each other in a second direction. The electrode pad structure may be between the two common source plugs, and the second direction may be parallel to the top surface of the substrate. An upper portion of the lower dummy group has a first width in the second direction, an upper portion of the upper dummy group has a second width in the second direction, and the first width may be greater than the second width.

BRIEF DESCRIPTION OF THE DRAWINGS

FIG. 5B illustrates a plan view showing an arrangement of lower vertical patterns VP1 of FIG. 3 according to some embodiments of inventive concepts.

FIGS. 12A, 13A, 14A, 15A, and 16A illustrate cross-sectional views taken along line I-I' of FIG. 2, showing a method of fabricating a three-dimensional semiconductor memory device according to some embodiments of inventive concepts.

FIGS. 12C, 13C, 14C, 15C, and 16C illustrate cross-sectional views taken along line III-III' of FIG. 7, showing a method of fabricating a three-dimensional semiconductor memory device according to some embodiments of inventive concepts.

DETAILED DESCRIPTION OF EMBODIMENTS

Some embodiments of inventive concepts are described below in detail in conjunction with the accompanying drawings to aid in clearly understanding inventive concepts. As used herein the term "and/or" includes any and all combinations of one or more of the associated listed items.

Figure 1:
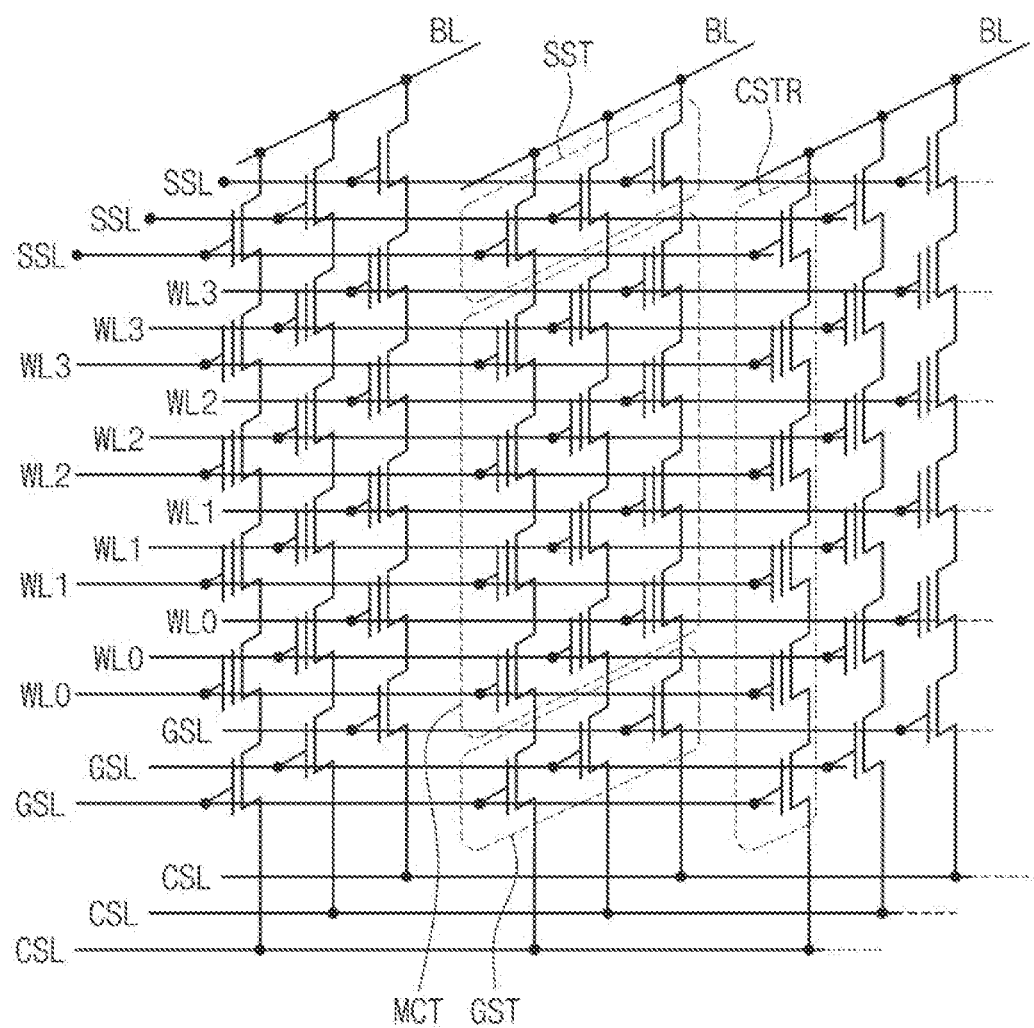
FIG. 1 illustrates a simplified circuit diagram showing a cell array of a three-dimensional semiconductor memory device according to some embodiments of inventive concepts.

FIG. 1 illustrates a simplified circuit diagram showing a cell array of a three-dimensional semiconductor memory device according to some embodiments of inventive concepts.

Referring to FIG. 1, a cell array 10 of a three-dimensional semiconductor memory device may include a common source line CSL, a plurality of bit lines BL, and a plurality of cell strings CSTR disposed between the common source line CSL and the bit lines BL. The common source line CSL may be a conductive layer (e.g., a thin conductive layer) disposed on a substrate or an impurity region formed in the substrate. The bit lines BL may be conductive patterns (e.g., metal lines) spaced apart from the substrate. The bit lines BL may be two-dimensionally arranged, and a plurality of cell strings CSTR may be connected in parallel to each of the bit lines BL. The cell strings CSTR are connected in common to the common source line CSL. In some embodiments, the common source line CSL may be provided in plural, and the plurality of common source lines CSL may be two-dimensionally arranged. The common source lines CSL may be supplied with the same voltage or electrically controlled independently of each other.

Each of the cell strings CSTR may be configured to include a ground select transistor GST coupled to (e.g., electrically connected to) the common source line CSL, a string select transistor SST coupled to (e.g., electrically connected to) the bit line BL, and a plurality of memory cell transistors MCT between the ground and string select transistors GST and SST. The ground select transistor GST, the string select transistor SST, and the memory cell transistors MCT may be connected in series. The common source line CSL may be connected in common to sources of the ground select transistors GST. The common source line CLS and the bit lines BL may be provided therebetween with ground select lines GSL, a plurality of word lines WL0 to WL3, and string select lines SSL, which lines GSL, WL0 to WL3, and SSL may serve as gate electrodes of the ground select transistors GST, the memory cell transistors MCT, and the string select transistors SST, respectively. Moreover, each of the memory cell transistors MCT may include a data storage element. Although FIG. 1 shows four word lines WL0 to WL3 between a pair of the ground select line GSL and the string select line SSL, it will be understood that more than four word lines can be located between a pair of the ground select line GSL and the string select line SSL.

Figure 2:
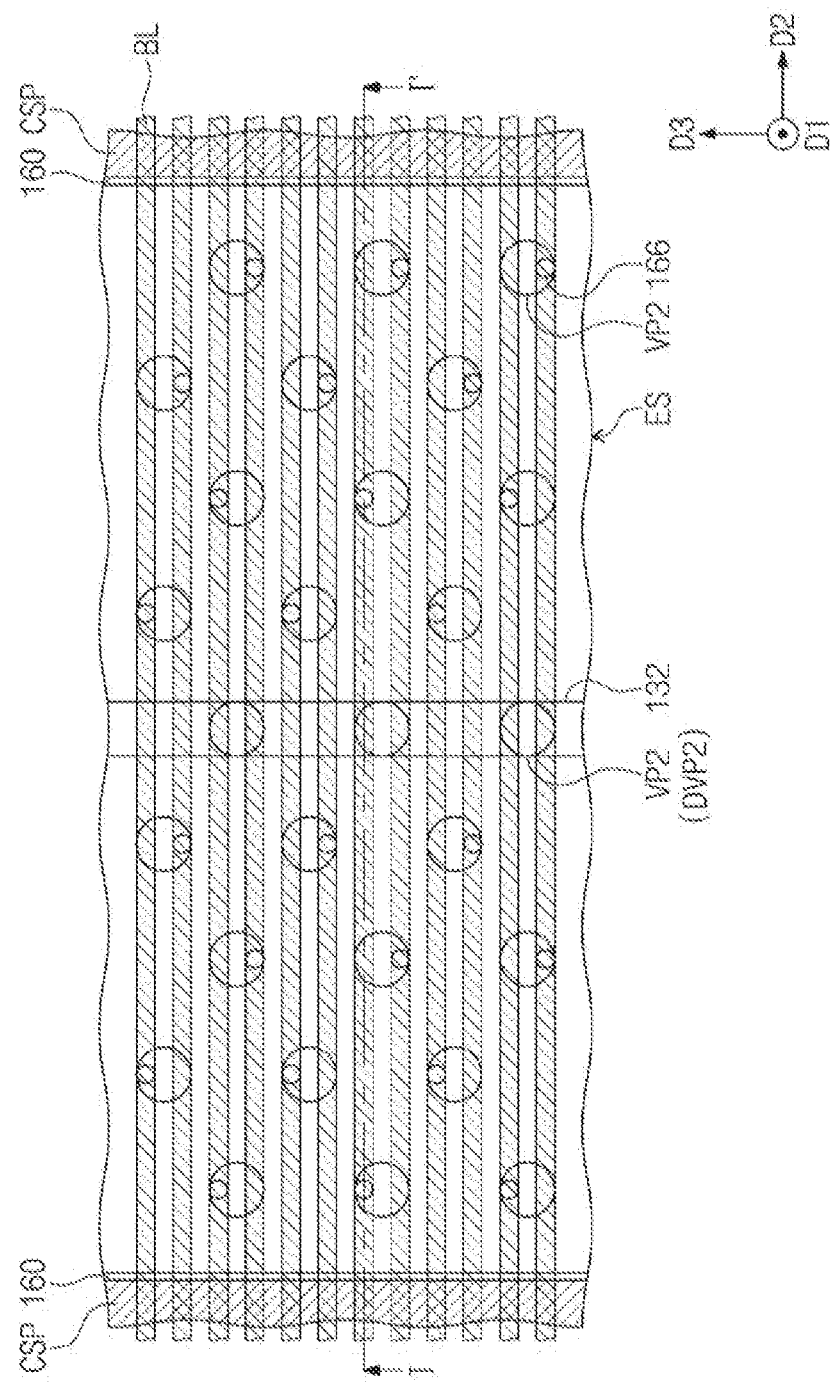
FIG. 2 illustrates a plan view showing a cell array of a three-dimensional semiconductor memory device according to some embodiments of inventive concepts.
Figure 3:
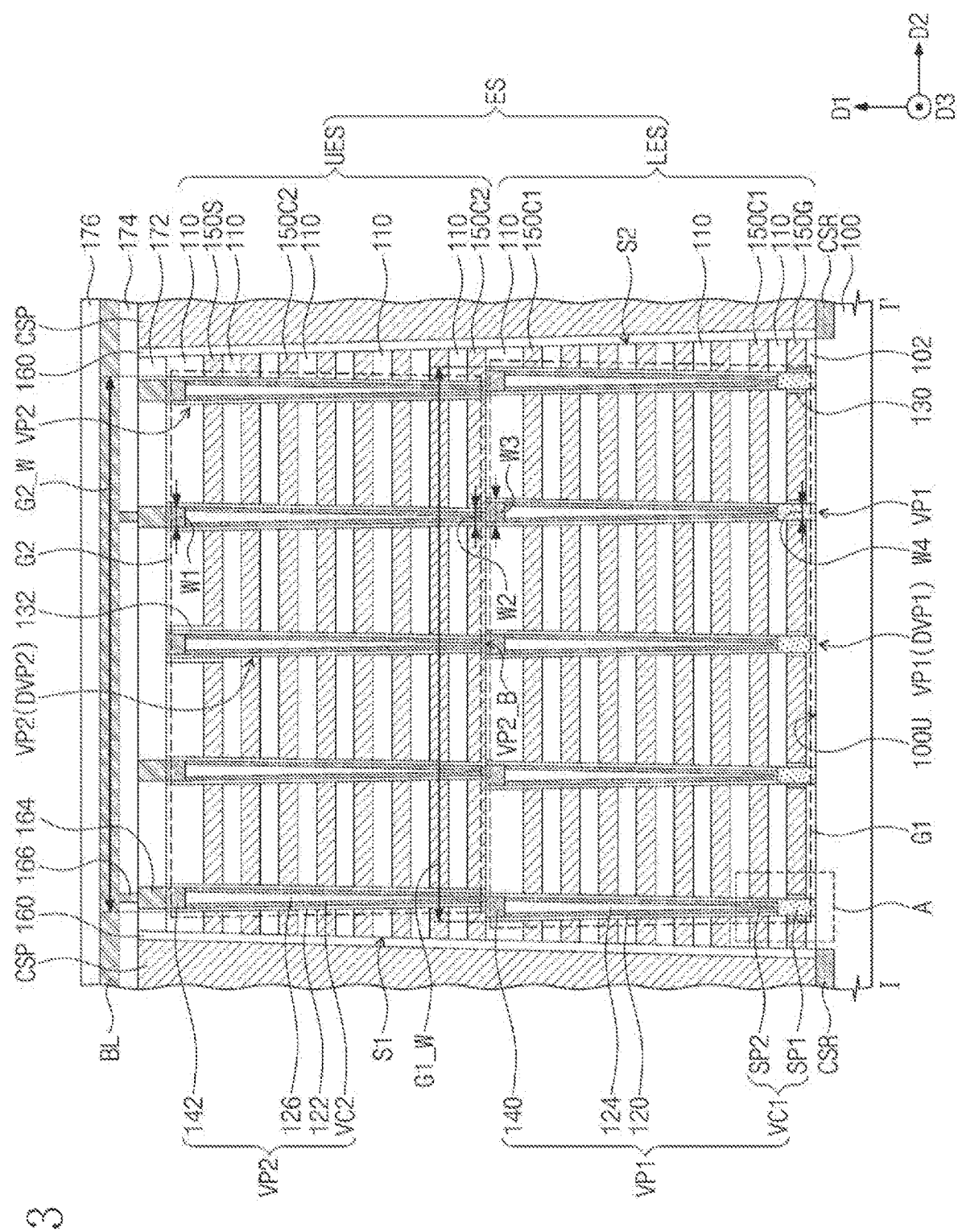
FIG. 3 illustrates a cross-sectional view taken along line I-I' of FIG. 2.
Figure 4:
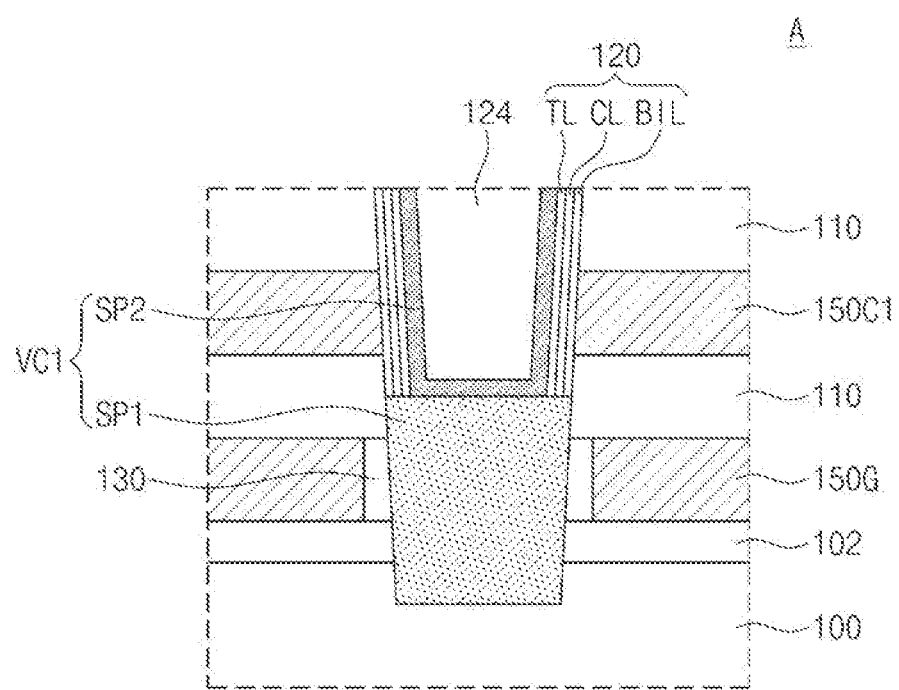
FIG. 4 illustrates an enlarged view showing section A of FIG. 3.
Figure 5A:
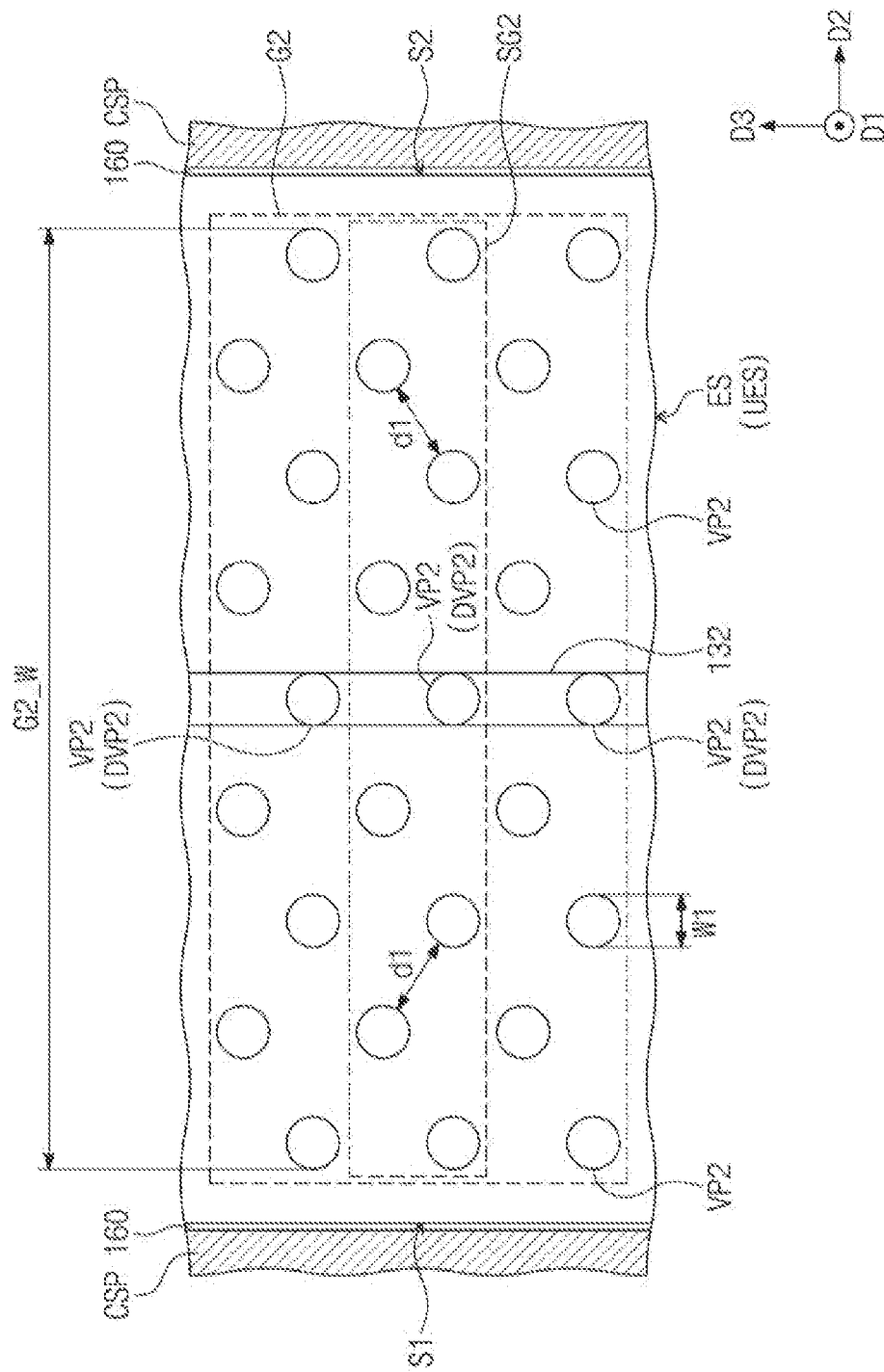
FIG. 5A illustrates a plan view showing an arrangement of upper vertical patterns VP2 of FIG. 3 according to some embodiments of inventive concepts.

FIG. 2 illustrates a plan view showing a cell array of a three-dimensional semiconductor memory device according to some embodiments of inventive concepts. FIG. 3 illustrates a cross-sectional view taken along line I-I' of FIG. 2. FIG. 4 illustrates an enlarged view showing section A of FIG. 3. FIG. 5A illustrates a plan view showing an arrangement of upper vertical patterns VP2 of FIG. 3. FIG. 5B illustrates a plan view showing an arrangement of lower vertical patterns VP1 of FIG. 3.

Referring to FIGS. 2 and 3, an electrode structure ES may be provided on a substrate 100. The substrate 100 may be a semiconductor substrate such as a silicon substrate, a germanium substrate, or a silicon-germanium substrate. The electrode structure ES may include gate electrodes 150G, 150C1, 150C2 and 150S stacked in a first direction D1 (e.g., a vertical direction) perpendicular to a top surface 100U of the substrate 100, and also include insulating layers 110 interposed between the gate electrodes 150G, 150C1, 150C2, and 150S. The gate electrodes 150G, 150C1, 150C2, and 150S and the insulating layers 110 may be alternately and repeatedly stacked on the substrate 100. The insulating layers 110 may electrically insulate the gate electrodes 150G, 150C1, 150C2, and 150S from each other. The gate electrodes 150G, 150C1, 150C2, and 150S may include a ground select electrode 150G, a string select electrode 150S, and cell electrodes 150C1 and 150C2 between the ground select electrode 150G and the string select electrode 150S. The cell electrodes 150C1 and 150C2 may include lower cell electrodes 150C1 adjacent to the ground select electrode 150G and upper cell electrodes 150C2 adjacent to the string select electrode 150S. The electrode structure ES may include a lower electrode structure LES including the ground select electrode 150G and the lower cell electrodes 150C1 and an upper electrode structure UES including the string select electrode 150S and the upper cell electrodes 150C2.

The string select electrode 150S may include a pair of string select electrodes 150S spaced apart from each other in a second direction D2 (e.g., a horizontal direction) parallel to the top surface 100U of the substrate 100. The pair of string select electrodes 150S may be separated from each other by a separation insulating pattern 132 interposed therebetween. The separation insulating pattern 132 may extend along a third direction D3 (e.g., a horizontal direction) parallel to the top surface 100U of the substrate 100 and intersecting the second direction D2. A buffer insulating layer 102 may be interposed between the electrode structure ES and the substrate 100. The insulating layers 110 and the buffer insulating layer 102 may have their thickness in the first direction D1. The insulating layers 110 may have substantially the same thickness, or one or more of the insulating layers 110 may be thicker than other insulating layers 110. The buffer insulating layer 102 may be thinner than the insulating layers 110. The insulating layers 110 may include a silicon oxide layer or a low-k dielectric layer, and the buffer insulating layer 102 may include an insulating material (e.g., a silicon oxide layer). The gate electrodes 150G, 150C1, 150C2, and 150S may include metal and/or metal nitride. The separation insulating pattern 132 may include an insulating material (e.g., a silicon oxide layer).

The substrate 100 may be provided thereon with a lower pattern group G1 including a plurality of lower vertical patterns VP1. Each of the lower vertical patterns VP1 may extend in the first direction D1, and may penetrate the lower electrode structure LES to come into connection with the substrate 100. The lower electrode structure LES may correspond to a lower portion of the electrode structure ES. It will be understood that the term "penetrate" can be interchangeable with "is/are in", "extend into," or "extend through."

Referring to FIGS. 3 and 4, each of the lower vertical patterns VP1 may include a lower vertical channel VC1 and a lower conductive pad 140 on the lower vertical channel VC1. The lower vertical channel VC1 may include, for example, a first semiconductor pattern SP1 that penetrates the ground select electrode 150G to come into connection with the substrate 100 and a second semiconductor pattern SP2 that penetrates the lower cell electrodes 150C1 to come into connection with the first semiconductor pattern SP1. The second semiconductor pattern SP2 may have a hollow pipe shape or a macaroni shape. The second semiconductor pattern SP2 may have a closed bottom end. The second semiconductor pattern SP2 may be, for example, an impurity-doped semiconductor or an impurity-undoped intrinsic semiconductor. The first semiconductor pattern SP1 may consist of a semiconductor material whose conductivity is the same as that of the substrate 100. The first semiconductor pattern SP1 may have a pillar shape that protrudes in the first direction D1 from the substrate 100. It will be understand that the first semiconductor pattern SP1 can have a shape different from a pillar shape.

Each of the lower vertical patterns VP1 includes a lower buried insulating pattern 124 filling (e.g., partially filling, completely filling) an inside of the second semiconductor pattern SP2 and a lower vertical insulator 120 interposed between the second semiconductor pattern SP2 and the lower electrode structure LES. The lower buried insulating pattern 124 may include, for example, silicon oxide. The lower vertical insulator 120 may have a macaroni shape or a pipe shape whose top and bottom ends are open. The lower vertical insulator 120 may have a bottom surface in contact with the first semiconductor pattern SP1.

The lower vertical insulator 120 may include a charge storage layer CL and a tunnel insulating layer TL. The tunnel insulating layer TL may be in direct contact with the second semiconductor pattern SP2, and the charge storage layer CL may be interposed between the tunnel insulating layer TL and the lower cell electrodes 150C1. The lower vertical insulator 120 may further include a blocking insulating layer BIL interposed between the charge storage layer CL and the lower cell electrodes 150C1. The charge storage layer CL may include, for example, one or more of a silicon nitride layer and a silicon oxynitride layer. The tunnel insulating layer TL may include a material whose energy band gap is greater than that of the charge storage layer CL. For example, the tunnel insulating layer TL may include a silicon oxide layer. The blocking insulating layer BIL may include a material whose energy band gap is greater than that of the charge storage layer CL. For example, the blocking insulating layer BIL may include a silicon oxide layer, a silicon nitride layer, and/or a silicon oxynitride layer.

A gate dielectric pattern 130 may be disposed between the first semiconductor pattern SP1 and the ground select electrode 150G. The gate dielectric pattern 130 may include, for example, a silicon oxide layer. The lower conductive pad 140 may be connected to the lower vertical channel VCL. The lower conductive pad 140 may be connected to a top end of the second semiconductor pattern SP2, and the first semiconductor pattern SP1 may be connected to a bottom end of the second semiconductor pattern SP2. The lower conductive pad 140 may include, for example, an impurity-doped semiconductor material and/or a conductive material.

Referring back to FIGS. 2 and 3, the substrate 100 may be provided thereon with an upper pattern group G2 including a plurality of upper vertical patterns VP2. Each of the upper vertical patterns VP2 may extend in the first direction D1, and may penetrate the upper electrode structure UES to come into connection with a corresponding one of the lower vertical patterns VP1. The upper electrode structure UES may correspond to an upper portion of the electrode structure ES. Each of the upper vertical patterns VP2 may include an upper vertical channel VC2 and an upper conductive pad 142 on the upper vertical channel VC2. The upper vertical channel VC2 may include, for example, a semiconductor pattern that penetrates the string select electrode 150S and the upper cell electrodes 150C2. The upper vertical channel VC2 may have a hollow pipe shape or a macaroni shape, and may include a closed bottom end. The upper vertical channel VC2 may include, for example, an impurity-doped semiconductor or an impurity-undoped intrinsic semiconductor. The upper vertical channel VC2 may be connected to the lower conductive pad 140 of each of the lower vertical patterns VP1.

Each of the upper vertical patterns VP2 may include an upper buried insulating pattern 126 filing an inside of the upper vertical channel VC2 and an upper vertical insulator 122 interposed between the upper vertical channel VC2 and the upper electrode structure UES. The upper buried insulating pattern 126 may include, for example, silicon oxide. The upper vertical insulator 122 may have a macaroni shape or a pipe shape whose top and bottom ends are open. The upper vertical insulator 122 may have a bottom surface, at least a portion of which is in contact with the lower conductive pad 140 of the lower vertical pattern VP1.

The upper vertical insulator 122 may include layers substantially the same as those of the lower vertical insulator 120. For example, the upper vertical insulator 122 may include the charge storage layer CL, the tunnel insulating layer TL, and the blocking insulating layer BIL that are discussed with reference to FIG. 4. The tunnel insulating layer TL may be in direct contact with the upper vertical channel VC2, and the charge storage layer CL may be interposed between the tunnel insulating layer TL and the upper cell electrodes 150C2 and between the tunnel insulating layer TL and the string select electrode 150S. The blocking insulating layer BIL may be interposed between the charge storage layer CL and the upper cell electrodes 150C2 and between the charge storage layer CL and the string select electrode 150S.

The upper conductive pad 142 may be connected to the upper vertical channel VC2. The upper conductive pad 142 may be connected to a top end of the upper vertical channel VC2, and the lower conductive pad 140 of each of the lower vertical patterns VP1 may be connected to a bottom end of the upper vertical channel VC2. The upper conductive pad 142 may include, for example, an impurity-doped semiconductor material and/or a conductive material.

The electrode structure ES may be disposed between common source regions CSR adjacent to each other. The common source regions CSR may be provided in the substrate 100 on opposite sides of the electrode structure ES, and may extend in the third direction D3. In some embodiments, a pair of common source regions CSR, which are on opposite sides of the electrode structure ES, may be spaced apart from each other in the second direction D2 as illustrated in FIG. 3. Common source plugs CSP may be provided on opposite sides of the electrode structure ES and correspondingly connected to the common source regions CSR. In some embodiments, a pair of common source plugs CSP, which are on opposite sides of the electrode structure ES, may be spaced apart from each other in the second direction D2 as illustrated in FIG. 3. The common source plugs CSP may extend in the third direction D3, and may be spaced apart from each other in the second direction D2 across the electrode structure ES. The electrode structure ES may include opposing sides including a first side surface S1 and a second side surface S2, and the first side surface S1 and the second side surface S2 are spaced apart from each other in the second direction D2 as illustrated in FIG. 3. The first and second side surfaces S1 and S2 may be sloped (e.g., slanted) relative to the top surface 100U of the substrate 100 such that the electrode structure ES may have a smaller width at a top end thereof and a larger width at a bottom end thereof. In some embodiments, a width of the electrode structure ES in the second direction D2 may monotonically decrease along the first direction D1 (e.g., a direction from the substrate to the bit line BL), as illustrated in FIG. 3. The common source plugs CSP may be disposed on the first and second side surfaces S1 and S2 of the electrode structure ES, respectively. Each of the common source plugs CSP may have a larger width at a top end thereof and a smaller width at a bottom end thereof. Each of the common source plugs CSP may have, on one side surface thereof, a slope substantially the same as that of a corresponding one of the first and second side surfaces S1 and S2. In some embodiments, a width of each of the common source plugs CSP in the second direction D2 may monotonically increase along the first direction D1 (e.g., a direction from the substrate to the bit line BL).

Side insulating spacers 160 may be disposed on the first and second side surfaces S1 and S2 of the electrode structure ES, respectively. Each of the side insulating spacer 160 may be interposed between the electrode structure ES and each of the common source plugs CSP. The common source plugs CSP may include a conductive material, and the side insulating spacers 160 may include, for example, silicon nitride.

Referring to FIGS. 3 and 5A, when viewed in plan, the upper vertical patterns VP2 may be arranged along the second and third directions D2 and D3. The upper pattern group G2 may have a width in the second direction D2. The upper pattern group G2 may have, at a top end thereof, a width G2_W corresponding to a distance from an upper portion of a first outermost upper vertical pattern VP2 which is most adjacent to (e.g., closest to) the first side surface S1 of the electrode structure ES, to an upper portion of a second outermost upper vertical pattern VP2 which is most adjacent to (e.g., closest to) the second side surface S2 of the electrode structure ES. Each of the upper vertical patterns VP2 may have a lower width W2 and an upper width W1 greater than the lower width W2. Each of the upper vertical patterns VP2 may have a width that becomes smaller toward its bottom end from its top end. In some embodiments, each of the upper vertical patterns VP2 may have a width in the second direction D2, which monotonically increases along the first direction D1 (e.g., a direction from the substrate to the bit line BL) as illustrated in FIG. 3.

The upper pattern group G2 may be divided into a plurality of upper sub-groups SG2. Each of the upper sub-groups SG2 may include the upper vertical patterns VP2 arranged in a zigzag fashion along the second direction D2 when viewed in plan. The upper sub-groups SG2 may be arranged along the third direction D3. The upper vertical patterns VP2 in each of the upper sub-groups SG2 may be spaced apart from each other at a first distance d1. The first distance d1 may be a length between a pair of directly adjacent ones of the upper vertical patterns VP2. At least one of the upper vertical patterns VP2 in each of the upper sub-groups SG2 may be a dummy upper vertical pattern DVP2 that penetrates the separation insulating pattern 132.

Referring to FIGS. 3 and 5B, when viewed in plan, the lower vertical patterns VP1 may be arranged along the second and third directions D2 and D3. The lower pattern group G1 may have a width in the second direction D2. The lower pattern group G1 may have, at a top end thereof, a width G1_W corresponding to a distance from an upper portion of a first outermost lower vertical pattern VP1 which is most adjacent to (e.g., closest to) the first side surface S1 of the electrode structure ES, to an upper portion of a second outermost lower vertical pattern VP1 which is most adjacent to (e.g., closest to) the second side surface S2 of the electrode structure ES. The width G1_W of the lower pattern group G1 may be greater than the width G2_W of the upper pattern group G2. In such a configuration, the lower vertical patterns VP1 may have a pitch greater than that of the upper vertical patterns VP2.

Each of the lower vertical patterns VP1 may have a lower width W4 and an upper width W3 greater than the lower width W4. Each of the lower vertical patterns VP1 may have a width that becomes smaller toward its bottom end from its top end. In some embodiments, the upper width W3 of each of the lower vertical patterns VP1 may be greater than the upper width W1 of each of the upper vertical patterns VP2.

The lower pattern group G1 may be divided into a plurality of lower sub-groups SG1. Each of the lower sub-groups SG1 may include the lower vertical patterns VP1 arranged in a zigzag fashion along the second direction D2 when viewed in plan. The lower sub-groups SG1 may be arranged along the third direction D3 and may be spaced apart from each other in the third direction D3. The lower vertical patterns VP1 in each of the lower sub-groups SG1 may be spaced apart from each other at a second distance d2. The second distance d2 may be a length between a pair of directly adjacent ones of the lower vertical patterns VP1. The distance d2 may be a shortest length of a gap between a pair of directly adjacent ones of the lower vertical patterns VP1 in a plan view as illustrated in FIG. 5B. It will be understand that the pair of directly adjacent ones of the lower vertical patterns VP1 are spaced apart from each other in a diagonal direction.

In some embodiments, the second distance d2 may be greater the first distance d1. In some embodiments, the second distance d2 may become greater toward the common source plugs CSP. In some embodiments, second distances d2 between two directly adjacent ones of the lower vertical patterns VP1 may be different, and, in some embodiments, the second distances d2 may increase along the second direction D2 from a center of the electrode structure ES to one of the common source plugs CSP. In some embodiments, at least one of the lower vertical patterns VP1 in each of the lower sub-groups SG1 may be a dummy lower vertical pattern DVP1 connected to the dummy upper vertical pattern DVP2.

The upper vertical patterns VP2 may have bottom surfaces VP2_B, which correspondingly overlap top surfaces of the lower vertical patterns VP1. In some embodiments, the dummy lower vertical pattern DVP1 may have a top surface whose center is aligned with a center of a bottom surface DVP2_B of the dummy upper vertical pattern DVP2 in a plan view as shown in FIG. 5B. Since the width G1_W of the lower pattern group G1 is greater than the width G2_W of the upper pattern group G2, centers of the top surfaces of the lower vertical patterns VP1, except for the dummy lower vertical patterns DVP1, may be offset in the second direction D2 (or a reverse direction to the second direction D2) from corresponding centers of bottom surfaces VP2_B of the upper vertical patterns VP2. An offset degree may become larger toward the common source plugs CSP, which offset degree is determined between the center of the top surface of the lower vertical pattern VP1 and the corresponding center of the bottom surface VP2_B of the upper vertical pattern VP2.

Figure 5C:
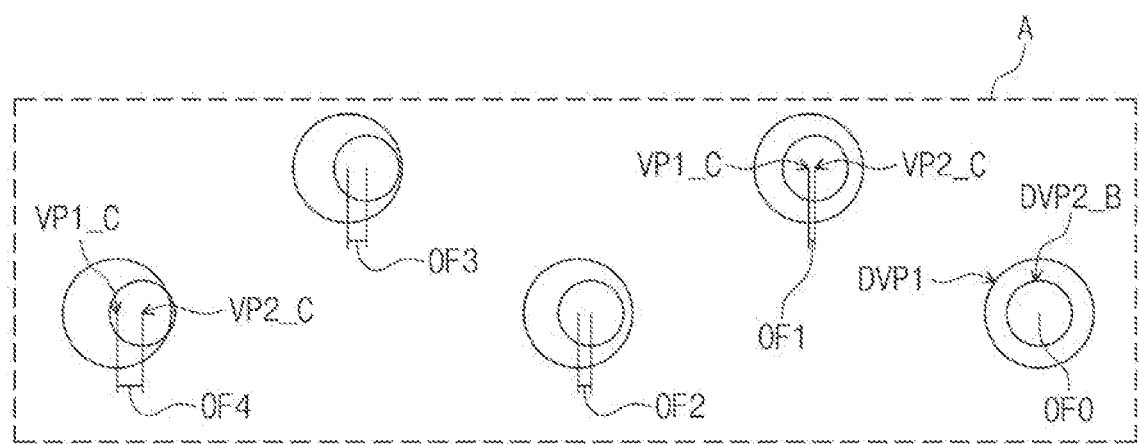
FIG. 5C illustrates the section A of FIG. 5B.

FIG. 5C shows the section A of FIG. 5B. Referring to FIG. 5C, in some embodiments, a center VP1_C of a top surface of a lower vertical pattern VP1 is offset from a center VP2_C of a bottom surface VP2_B of a corresponding upper vertical pattern VP2 by a predetermined distance (e.g., OF1, OF2, OF3, and OF4) in the second direction D2 toward one of the common source plugs CSP. In some embodiments, a distance between a center VP1_C of a top surface of a lower vertical pattern VP1 and a center VP2_C of a bottom surface VP2_B of a corresponding upper vertical pattern VP2 may be constant, and OF1, OF2, OF3, and OF4 may be the same. In some embodiments, as illustrated in FIG. 5C, a distance (e.g., OF1, OF2, OF3, and OF4) between a center VP1_C of a top surface of a lower vertical pattern VP1 and a center VP2_C of a bottom surface VP2_B of a corresponding upper vertical pattern VP2 may increase (e.g., monotonically) in the second direction D2 from the dummy lower vertical pattern DVP1 toward the common source plugs CSP. In some embodiments, a center of the dummy lower vertical pattern DVP1 may not be offset from a center of the bottom surface DVP2_B of the dummy upper vertical pattern DVP2.

Although FIGS. 5B and 5C show top surfaces of lower vertical patterns VP1 and bottom surfaces VP2_B of upper vertical patterns VP2 have a circle shape, in some embodiments, top surfaces of lower vertical patterns VP1 and bottom surfaces VP2_B of upper vertical patterns VP2 may have different shapes (e.g., an oval shape, a rectangular shape). When top surfaces of lower vertical patterns VP1 and bottom surfaces VP2_B of upper vertical patterns VP2 have non-circle shapes, a midpoint of a top surface of a lower vertical pattern VP1 in the second direction D2 may be offset from a midpoint of a bottom surface VP2_B of a corresponding upper vertical pattern VP2 in the second direction D2 by a predetermined distance in the second direction D2 from the dummy lower vertical pattern DVP1 toward the common source plugs CSP.

An improvement in integration of semiconductor devices may require an increase in the number of the gate electrodes 150G, 150C1, 150C2, and 150S stacked in the first direction D1 on the substrate 100. The electrode structure ES may thus increase in height, and as a result, the common source plugs CSP may have their increased aspect ratio. In this case, each of the common source plugs CSP may be formed to have a lower width (e.g., a width of a lower portion) less than an upper width (e.g., a width of an upper portion), and the electrode structure ES may be formed to have an upper width (e.g., a width of an upper portion) less than a lower width (e.g., a width of a lower portion). When the lower vertical patterns VP1 and the upper vertical patterns VP2 are formed to have substantially the same pitch, one side of the electrode structure ES and its adjacent outermost lower vertical pattern VP1 may be spaced apart at a distance greater than that between the one side of the electrode structure ES and its adjacent outermost upper vertical pattern VP2. For example, the outermost lower vertical pattern VP1 may be farther away than the outermost upper vertical pattern VP2 from the one side of the electrode structure ES. In this case, during the formation of the gate electrodes 150G, 150C1, 150C2, and 150S of the electrode structure ES, the insulating layers 110 provided in a lower portion of the electrode structure ES may become closer to or in contact with each other. Accordingly, the gate electrodes 150G, 150C1, 150C2, and 150S may be hardly formed or formed to have abnormal shapes between the insulating layers 110.

According to inventive concepts, the width G1_W of the lower pattern group G1 including the lower vertical patterns VP1 may be greater than the width G2_W of the upper pattern group G2 including the upper vertical patterns VP2. For example, the lower vertical patterns VP1 may have a pitch greater than that of the upper vertical patterns VP2. In this case, the lower vertical patterns VP1 may stably support the insulating layers 110 during the formation of the gate electrodes 150G, 150C1, 150C2, and 150S of the electrode structure ES, which may result in possibly minimizing or reducing defects of the gate electrodes 150G, 150C1, 150C2, and 150S. Moreover, since the lower vertical patterns VP1 are formed to have a relatively large pitch, a process margin may be increased when the lower vertical patterns VP1 are formed. As a result, it may be possible to provide a three-dimensional semiconductor memory device having improved integration and structural stability.

Referring back to FIGS. 2 and 3, an upper capping insulating layer 172 may be disposed on the electrode structure ES, and may cover a top surface of the electrode structure ES and top surfaces of the upper conductive pads 142. The upper capping insulating layer 172 may have a top surface coplanar (e.g., substantially coplanar) with those of the common source plugs CSP. A first interlayer dielectric layer 174 may be provided on the upper capping insulating layer 172, and may cover the top surfaces of the common source plugs CSP. The upper capping insulating layer 172 and the first interlayer dielectric layer 174 may include an insulating material (e.g., silicon oxide).

A first contact 164 may be provided on the upper conductive pad 142 of each of the upper vertical patterns VP2. The first contact 164 may penetrate the upper capping insulating layer 172 to come into connection with (e.g., to directly contact) the upper conductive pad 142. A second contact 166 may penetrate the first interlayer dielectric layer 174 to come into connection with the first contact 164. The first and second contacts 164 and 166 may include a conductive material. Bit lines BL may be provided on the first interlayer dielectric layer 174. The bit lines BL may extend in the second direction D2, and may be spaced apart from each other in the third direction D3. Each of the upper vertical patterns VP2, except for the dummy upper vertical pattern DVP2, may be electrically connected to a corresponding one of the bit lines BL through the first and second contacts 164 and 166. The bit lines BL may include a conductive material. The first interlayer dielectric layer 174 may be provided thereon with a second interlayer dielectric layer 176 covering the bit lines BL. The second interlayer dielectric layer 176 may include an insulating material (e.g., silicon oxide).

Figure 6:
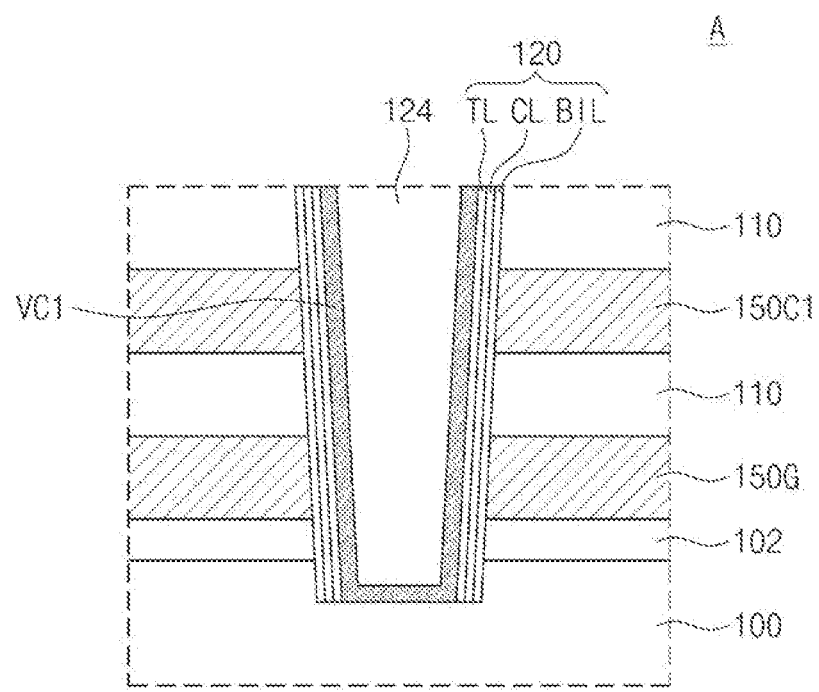
FIG. 6 illustrates an enlarged view showing section A of FIG. 3, partially showing a three-dimensional semiconductor memory device according to some embodiments of inventive concepts.

FIG. 6 illustrates an enlarged view showing section A of FIG. 3, partially showing a three-dimensional semiconductor memory device according to some embodiments of inventive concepts.

Referring to FIGS. 3 and 6, each of the lower vertical patterns VP1 may include a lower vertical channel VC1 and a lower conductive pad 140 on the lower vertical channel VC1. According to some embodiments, the lower vertical channel VC1 may include a semiconductor pattern that penetrates the lower cell electrodes 150C1 and the ground select electrode 150G. The lower vertical channel VC1 may have a hollow pipe shape or a macaroni shape, and may include a closed bottom end. The bottom end of the lower vertical channel VC1 may be disposed in the substrate 100, and the lower vertical channel VC1 may be directly connected to (e.g., may directly contact) the substrate 100. The lower vertical channel VC1 may include, for example, an impurity-doped semiconductor or an impurity-undoped intrinsic semiconductor.

Each of the lower vertical patterns VP1 may include a lower buried insulating pattern 124 filing (e.g., partially filling, completely filling) an inside of the lower vertical channel VC1 and a lower vertical insulator 120 interposed between the lower vertical channel VC1 and the lower electrode structure LES. The lower buried insulating pattern 124 may include, for example, silicon oxide. The lower vertical insulator 120 may have a macaroni shape or a pipe shape whose top and bottom ends are open. The lower vertical insulator 120 may have a bottom surface in contact with the substrate 100. The lower vertical insulator 120 may include a charge storage layer CL, a tunnel insulating layer TL, and a blocking insulating layer BIL. The tunnel insulating layer TL may be in direct contact with the lower vertical channel VC1, and the charge storage layer CL may be interposed between the tunnel insulating layer TL and the lower cell electrodes 150C1 and between the tunnel insulating layer TL and the ground select electrode 150G. The blocking insulating layer BIL may be interposed between the charge storage layer CL and the lower cell electrodes 150C1 and between the charge storage layer CL and the ground select electrode 150G. Except for the mentioned above, the charge storage layer CL, the tunnel insulating layer TL, and the blocking insulating layer BIL may be substantially the same as the charge storage layer CL, the tunnel insulating layer TL, and the blocking insulating layer BIL discussed with reference to FIG. 4.

Figure 7:
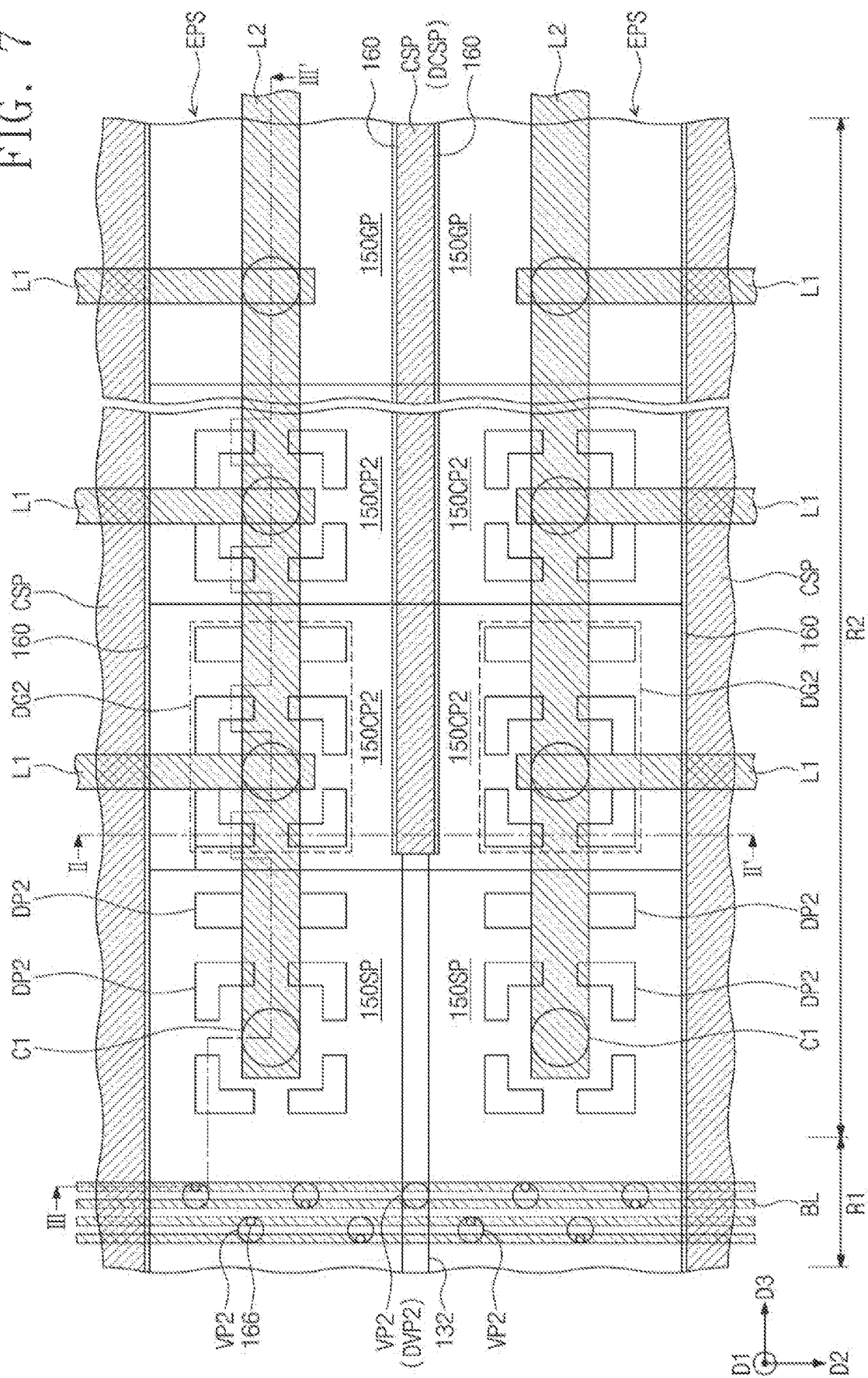
FIG. 7 illustrates a plan view showing a three-dimensional semiconductor memory device according to some embodiments of inventive concepts.
Figure 8:
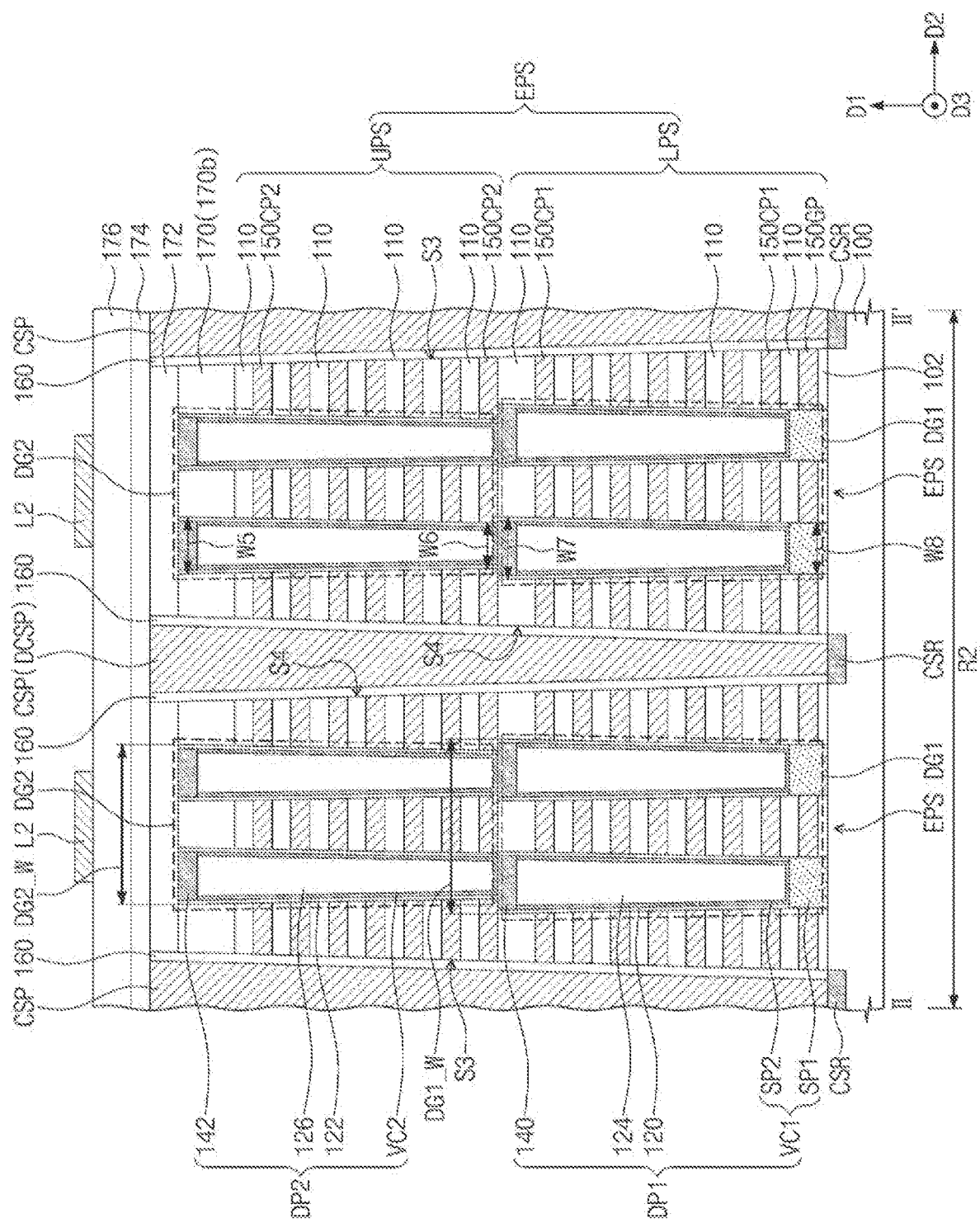
FIG. 8 illustrates a cross-sectional view taken along line II-II' of FIG. 7.
Figure 9:
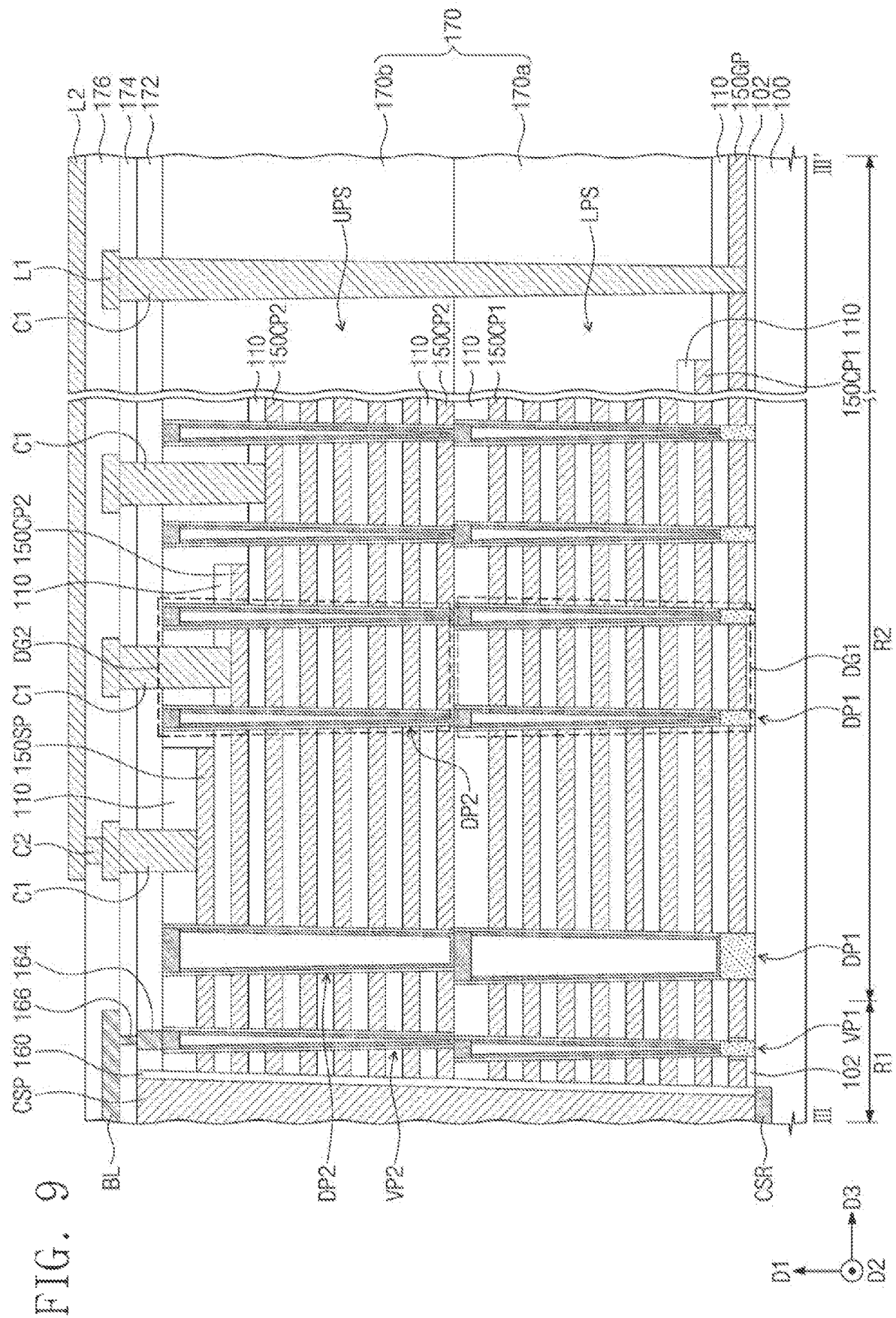
FIG. 9 illustrates a cross-sectional view taken along line III-III' of FIG. 7.
Figure 10A:
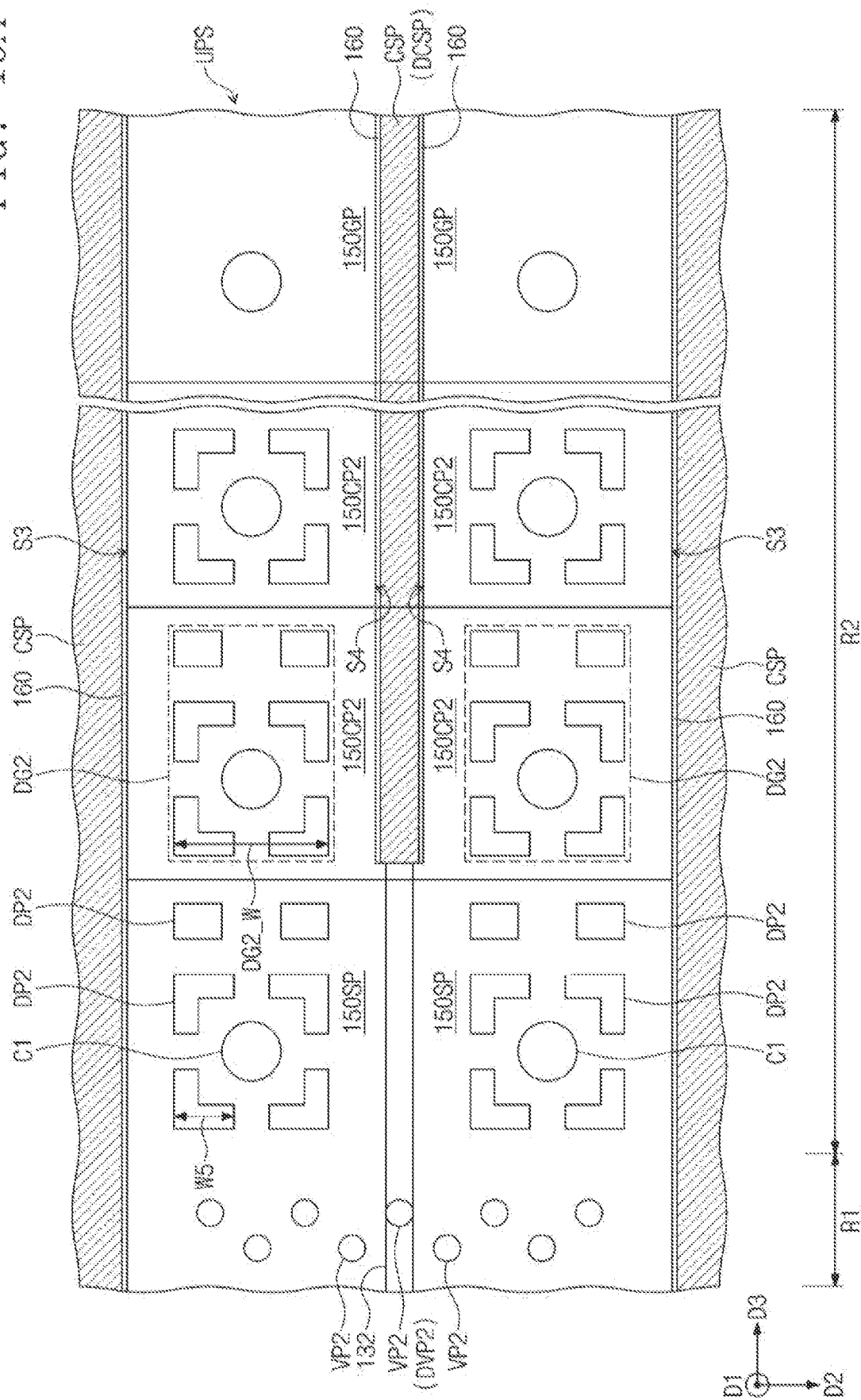
FIG. 10A illustrates a plan view showing an arrangement of upper dummy pillars DP2 of FIG. 8.
Figure 10B:
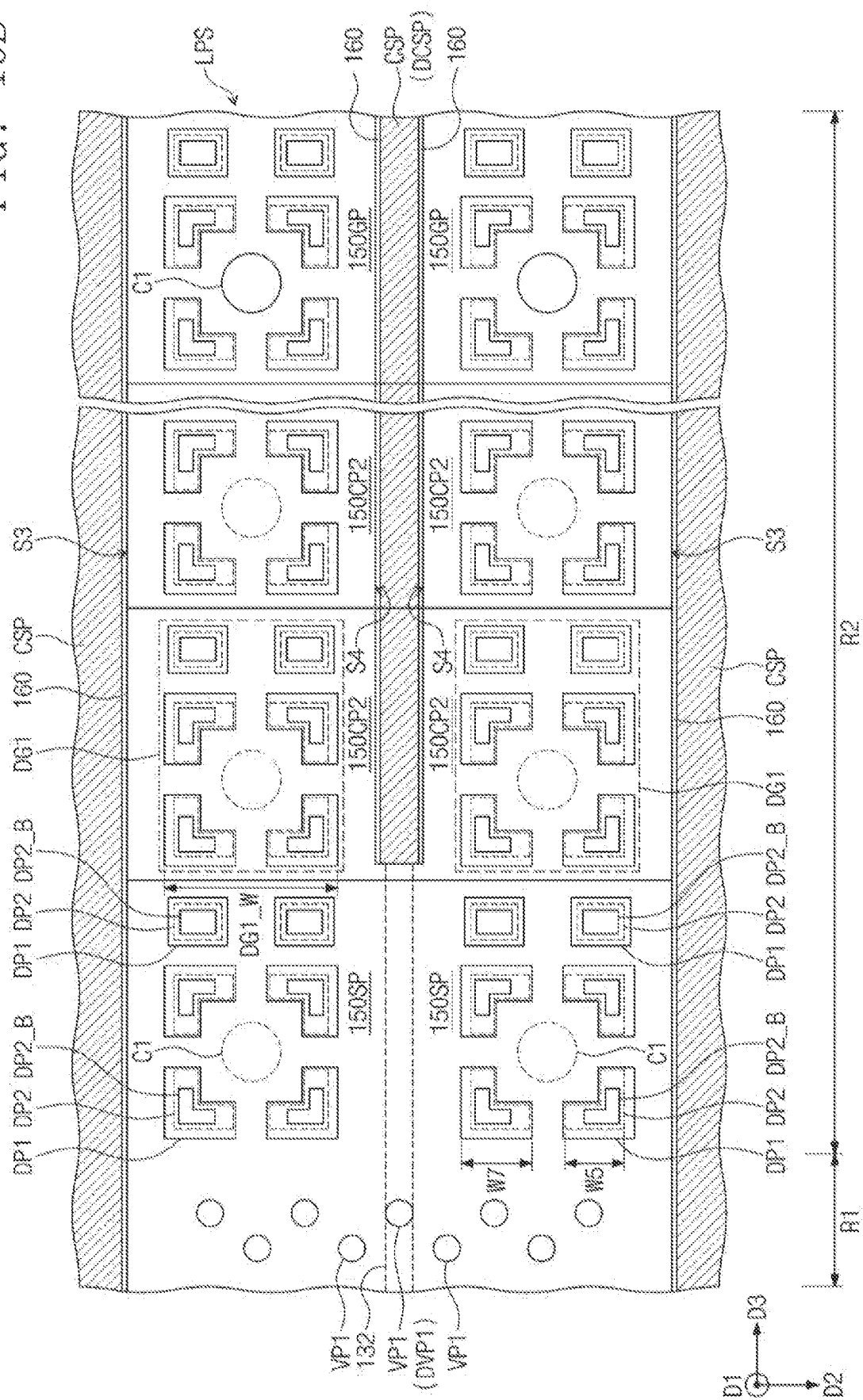
FIG. 10B illustrates a plan view showing an arrangement of lower dummy pillars DP1 of FIG. 8.

FIG. 7 illustrates a plan view showing a three-dimensional semiconductor memory device according to some embodiments of inventive concepts. FIG. 8 illustrates a cross-sectional view taken along line II-II' of FIG. 7. FIG. 9 illustrates a cross-sectional view taken along line III-III' of FIG. 7. FIG. 10A illustrates a plan view showing an arrangement of upper dummy pillars DP2 of FIG. 8. FIG. 10B illustrates a plan view showing an arrangement of lower dummy pillars DP1 of FIG. 8. The same technical features as those of the three-dimensional semiconductor memory device discussed with reference to FIGS. 1 to 6 may be briefly discussed or omitted for brevity of description. It will be understood that the term "pillar" is used not to limit shapes of the upper dummy pillars DP2 and lower dummy pillars DP1 to a pillar shape. In some embodiments, the upper dummy pillars DP2 and lower dummy pillars DP1 may have shapes different from a pillar shape. Accordingly, it will be understood that the upper dummy pillars DP2 and lower dummy pillars DP1 can be referred to as "the upper dummy structures" and "lower dummy structures," respectively.

Referring to FIGS. 7, 8, and 9, the substrate 100 may include a first region R1 and a second region R2. The first region R1 may be a cell area where memory cells are three-dimensionally arranged, and the second region R2 may be a connection area where pads are provided. The electrode structure ES may be provided on the first region R1 of the substrate 100. The second region R2 may be provided thereon with a pair of pad structures EPS extending from one side of the electrode structure ES. Each of the pad structures EPS may include electrode pads 150GP, 150CP1, 150CP2, and 150SP respectively extending from the gate electrodes 150G, 150C1, 150C2, and 150S, and also include the insulating layers 110 between the electrode pads 150GP, 150CP1, 150CP2, and 150SP. The insulating layers 110 may electrically insulate the electrode pads 150GP, 150CP1, 150CP2, and 150SP from each other. The electrode pads 150GP, 150CP1, 150CP2, and 150SP may form (e.g., constitute) a stepwise structure on the second region R2 of the substrate 100. For example, in some embodiments, each of the electrode pads 150GP, 150CP1, 150CP2, and 150SP may have an exposed top surface that is not covered with a next overlying one of the electrode pads 150GP, 150CP1, 150CP2, and 150SP as illustrated in FIG. 9.

The electrode pads 150GP, 150CP1, 150CP2, and 150SP may include a ground select pad 150GP extending from the ground select electrode 150G, a string select pad 150SP extending from the string select electrode 150S, and cell pads 150CP1 and 150CP2 respectively extending from the cell electrodes 150C1 and 150C2. The cell pads 150CP1 and 150CP2 may include lower cell pads 150CP1 adjacent to the ground select pad 150GP and upper cell pads 150CP2 adjacent to the string select pad 150SP. The lower cell pads 150CP1 may be closer than the upper cell pads 150CP2 to the substrate 100. Each of the pad structures EPS may include a lower pad structure LPS including the ground select pad 150GP and the lower cell pads 150CP1 and an upper pad structure UPS including the string select pad 150SP and the upper cell pads 150CP2.

The separation insulating pattern 132 may extend onto the second region R2 of the substrate 100 and lie between the string select pads 150SP of the pad structures EPS. The buffer insulating layer 102 may extend onto the second region R2 of the substrate 100 and may be between the substrate 100 and each of the pad structures EPS. Each of the common source regions CSR may extend toward the second region R2 of the substrate 100 and may be provided in the substrate 100 at one side of each of the pad structures EPS. An additional common source region CSR may be provided in the substrate 100 between the pad structures EPS, and may extend in the third direction D3. The pad structure EPS may be provided on its one side with the common source plug CSP that extends toward the second region R2 of the substrate 100 and is connected to a corresponding one of the common source regions CSR. An additional common source plug CSP may be provided on the substrate 100 between the pad structures EPS and connected to the additional common source region CSR. The additional common source plug CSP may be a dummy common source plug DCSP to which no voltage is applied. The common source plugs CSP and the additional common source plug CSP may extend in parallel to the third direction D3. Each of the common source plugs CSP and the additional common source plug CSP may be spaced apart in the second direction D2 from each other across each of the pad structures EPS.

Each of the pad structures EPS may include a third side surface S3 and a fourth side surface S4 opposite to each other in the second direction D2. The third side surface S3 and the fourth side surface S4 of the pad structure EPS are opposing sides that are spaced apart from each other in the second direction D2. In some embodiments, the fourth side surfaces S4 of two adjacent pad structures EPS may face each other, as illustrated in FIG. 8. The third and fourth side surfaces S3 and S4 of each of the pad structures EPS may be sloped relative to the top surface 100U of the substrate 100 such that each of the pad structures EPS may have a smaller width at a top end thereof and a larger width at a bottom end thereof. The common source plugs CSP may be disposed on the third side surfaces S3 of the pad structures EPS, respectively, and the additional common source plug CSP may be interposed between the fourth side surfaces S4 of the pad structures EPS. Hereinafter, the addition common source plug CSP and the common source plugs CSP may together be called common source plugs CSP. Each of the common source plugs CSP may have a larger width at a top end thereof and a smaller width at a bottom end thereof. Each of the common source plugs CSP may have, on one side surface thereof, a slope substantially the same as that of a corresponding one of the third and fourth side surfaces S3 and S4. In some embodiments, a side of one of the common source plugs CSP extends parallel to a side of one of the pad structures EPS (e.g., the third and fourth side surfaces S3 and S4), which faces the side of the one of the common source plugs CSP, as illustrated in FIG. 8.

The side insulating spacers 160 may extend toward the second region R2 of the substrate 100, and may be correspondingly provided on the third side surfaces S3 of the pad structures EPS. An additional side insulating spacer 160 may be disposed on the fourth side surface S4 of each of the pad structures EPS. Hereinafter, the additional side insulating spacer 160 and the side insulating spacers 160 may together be called side insulating spacers 160. The side insulating spacer 160 may be interposed between each of the common source plugs CSP and each of the pad structures EPS.

First pad contact plugs C1 may be provided on the second region R2 of the substrate 100, and correspondingly connected to the electrode pads 150GP, 150CP1, 150CP2, and 150SP of each of the pad structures EPS. The first pad contact plugs C1 may be arranged along the third direction D3. In some embodiments, the first pad contact plugs C1 may be spaced apart from each other in the third direction D3, as illustrated in FIG. 7.

Each of a plurality of dummy pillars DP1 and DP2 may penetrate a corresponding one 150CP1, 150CP2, or 150SP of the electrode pads 150GP, 150CP1, 150CP2, and 150SP, and also penetrate the pad structure EPS below the corresponding electrode pad 150CP1, 150CP2, or 150SP. The plurality of dummy pillars DP1 and DP2 may include lower dummy pillars DP1 penetrating the lower pad structure LPS and upper dummy pillars DP2 penetrating the upper pad structure UPS. Each of the lower dummy pillars DP1 may penetrate the lower pad structure LPS to come into connection with the substrate 100. Each of the upper dummy pillars DP2 may penetrate the upper pad structure UPS and the corresponding electrode pad 150CP1, 150CP2, or 150SP. The lower pad structure LPS may correspond to a lower portion of the pad structure EPS, and the upper pad structure UPS may correspond to an upper portion of the pad structure EPS. A lower dummy group DG1 including the lower dummy pillars DP1 may be disposed between the substrate 100 and an upper dummy group DG2 including the upper dummy pillars DP2. The upper dummy pillars DP2 in the upper dummy group DG2 may be disposed to surround a corresponding one of the first pad contact plugs C1.

The lower dummy pillars DP1 may include elements (e.g., constituent parts) substantially the same as those of the lower vertical patterns VP1. For example, as discussed with reference to FIGS. 3 and 4, each of the lower dummy pillars DP1 may include the lower vertical channel VC1 and the lower conductive pad 140 on the lower vertical channel VC1. The lower vertical channel VC1 may include the first semiconductor pattern SP1 and the second semiconductor pattern SP2. Each of the lower dummy pillars DP1 may include the lower buried insulating pattern 124 filling (e.g., partially filling, completely filling) an inside of the second semiconductor pattern SP2, and also include the lower vertical insulator 120 surrounding an outer surface of the second semiconductor pattern SP2. The lower dummy pillars DP1 may include the same material as those of the lower vertical patterns VP1. The upper dummy pillars DP2 may include elements (e.g., constituent parts) substantially the same as those of the upper vertical patterns VP2. For example, as discussed with reference to FIG. 3, each of the upper dummy pillars DP2 may include the upper vertical channel VC2 and the upper conductive pad 142 on the upper vertical channel VC2. Each of the upper dummy pillars DP2 may include the upper buried insulating pattern 126 filling an inside of the upper vertical channel VC2, and also include the upper vertical insulator 122 surrounding an outer surface of the upper vertical channel VC2. The upper dummy pillars DP2 may include the same material as those of the upper vertical patterns VP2.

Referring to FIGS. 8, 9, and 10A, when viewed in plan, the upper dummy pillars DP2 in the upper dummy group DG2 may be arranged to surround a corresponding one of the first pad contact plugs C1. The upper dummy group DG2 may have a width in the second direction D2. The upper dummy group DG2 may have, at a top end thereof, a width DG2_W corresponding to a distance from an upper portion of a first outermost upper dummy pillar DP2 which is most adjacent to (e.g., closest to) the third side surface S3 of each of the pad structures EPS, to an upper portion of a second outermost upper dummy pillar DP2 which is most adjacent to (e.g., closest to) the fourth side surface S4 of each of the pad structures EPS. Each of the upper dummy pillars DP2 may have a width in the second direction D2. Each of the upper dummy pillars DP2 may have a lower width (e.g., a width of a lower portion) W6 and an upper width W5 (e.g., a width of an upper portion) greater than the lower width W6. Each of the upper dummy pillars DP2 may have a width that becomes smaller toward its bottom end from its top end. In some embodiments, each of the upper dummy pillars DP2 may have a width in the second direction D2 that monotonically decreases toward its bottom end from its top end as illustrated in FIG. 8.

Referring to FIGS. 8, 9, and 10B, the lower dummy pillars DP1 in the lower dummy group DG1 may be disposed and connected to corresponding upper dummy pillars DP2 in the upper dummy group DG2. In this case, when viewed in plan, the lower dummy pillars DP1 may be arranged to surround a corresponding one of the first pad contact plugs C1, as illustrated in FIG. 10B. The lower dummy group DG1 may have a width in the second direction D2. The lower dummy group DG1 may have, at a top end thereof, a width DG1_W corresponding to a distance from an upper portion of a first outermost lower dummy pillar DP1 which is most adjacent to the third side surface S3 of each of the pad structures EPS, to an upper portion of a second outermost lower dummy pillar DP1 which is most adjacent to the fourth side surface S4 of each of the pad structures EPS. The width DG1_W of the lower dummy group DG1 may be greater than the width DG2_W of the upper dummy group DG2. For example, the lower dummy pillars DP1 may have a pitch greater than that of the upper dummy pillars DP2.

Each of the lower dummy pillars DP1 may have a width in the second direction D2. Each of the lower dummy pillars DP1 may have a lower width W8 (e.g., a width of a lower portion) and an upper width (e.g., a width of an upper portion) W7 greater than the lower width W8. Each of the lower dummy pillars DP1 may have a width that becomes smaller toward its bottom end from its top end. In some embodiments, the upper width W7 of each of the lower dummy pillars DP1 may be greater than the upper width W5 of each of the upper dummy pillars DP2. The upper dummy pillars DP2 may have bottom surfaces DP2_B that correspondingly overlap top surfaces of the lower dummy pillars DP1, but inventive concepts are not limited thereto.

An improvement in semiconductor devices may require an increase in the number of the gate electrodes 150G, 150C1, 150C2, and 150S, which may cause an increase in the number of the electrode pads 150GP, 150CP1, 150CP2, and 150SP respectively extending from the gate electrodes 150G, 150C1, 150C2, and 150S. Each of the pad structures EPS may thus increase in height, and as a result, the common source plugs CSP may have their increased aspect ratio. In this case, each of the common source plugs CSP may be formed to have a lower width (e.g., a width of a lower portion) less than an upper width (e.g., a width of an upper portion), and each of the pad structures EPS may be formed to have an upper width (e.g., a width of an upper portion) less than a lower width (e.g., a width of a lower portion). When the lower dummy pillars DP1 and the upper dummy pillars DP2 are formed to have substantially the same pitch, one side of each of the pad structures EPS and its adjacent outermost lower dummy pillar DP1 may be spaced apart at a distance greater than that between the one side of each of the pad structures EPS and its adjacent outermost upper dummy pillar DP2. For example, the outermost lower dummy pillar DP1 may be farther away than the outermost upper dummy pillar DP2 from the one side of the pad structure EPS. In this case, during the formation of the electrode pads 150GP, 150CP1, 150CP2, and 150SP of each of the pad structures EPS, the insulating layers 110 provided in a lower portion of each of the pad structures EPS may become closer to or in contact with each other. Accordingly, the electrode pads 150GP, 150CP1, 150CP2, and 150SP may be hardly formed or formed to have abnormal shapes between the insulating layers 110.

According to inventive concepts, the width DG1_W of the lower dummy group DG1 including the lower dummy pillars DP1 may be greater than the width DG2_W of the upper dummy group DG2 including the upper dummy pillars DP2. For example, the lower dummy pillars DP1 may have a pitch greater than that of the upper dummy pillars DP2. In this case, the lower dummy pillars DP1 may stably support the insulating layers 110 during the formation of the electrode pads 150GP, 150CP1, 150CP2, and 150SP of each of the pad structures EPS, which may result in minimizing or reducing defects of the electrode pads 150GP, 150CP1, 150CP2, and 150SP. Moreover, since the lower dummy pillars DP1 are formed to have a relatively large pitch, a process margin may be increased when the lower dummy pillars DP1 are formed.

Referring back to FIGS. 7, 8, and 9, a lower capping insulating layer 170 may be provided on the second region R2 of the substrate 100, and may cover the string select pad 150SP, the cell pads 150CP1 and 150CP2, and the ground select pad 150GP. The lower capping insulating layer 170 may include a first sub-capping insulating layer 170a covering the lower cell pads 150CP1 and the ground select pad 150GP, and also include a second sub-capping insulating layer 170b covering the upper cell pads 150CP2 and the string select pad 150SP. The first and second sub-capping insulating layers 170a and 170b may include an insulating material (e.g., silicon oxide). The lower capping insulating layer 170 has a top surface substantially coplanar with that of each of the pad structures EPS. For example, the top surface of the lower capping insulating layer 170 may be substantially coplanar with that of an uppermost one of the insulating layers 110 in each of the pad structure EPS. The upper capping insulating layer 172 may extend onto the second region R2 of the substrate 100, and may cover the pad structures EPS and the lower capping insulating layer 170. The upper capping insulating layer 172 may cover top surfaces of the upper dummy pillars DP2. The upper capping insulating layer 172 may have a top surface substantially coplanar with those of the common source plugs CSP. The first interlayer dielectric layer 174 may extend onto the second region R2 of the substrate 100, and may cover the top surfaces of the common source plugs CSP.

The first pad contact plugs C1 may penetrate the first interlayer dielectric layer 174 and the upper capping insulating layer 172, and thus may be correspondingly provided on the electrode pads 150GP, 150CP1, 150CP2, and 150SP. Ones of the first pad contact plugs C1 may penetrate the lower capping insulating layer 170 to come into connection with corresponding ones of the electrode pads 150GP, 150CP1, 150CP2, and 150SP. The first pad contact plugs C1 may have top surfaces substantially coplanar with that of the first interlayer dielectric layer 174. The first pad contact plugs C1 may include a conductive material.

First pad lines L1 may be provided on the second region R2 of the substrate 100. The first pad lines L1 may be provided on the first interlayer dielectric layer 174 and correspondingly connected to the first pad contact plugs C1. Each of the first pad lines L1 may be connected to a corresponding one of the electrode pads 150GP, 150CP1, 150CP2, and 150SP through a corresponding one of the first pad contact plugs C1. The second interlayer dielectric layer 176 may extend onto the second region R2 of the substrate 100, and may cover the first pad lines L1. The second interlayer dielectric layer 176 may be provided therein with a second pad contact plug C2 connected to a corresponding one of the first pad lines L1. The second interlayer dielectric layer 176 may be provided thereon with a second pad line L2 connected to the second pad contact plug C2. The second pad line L2 may be electrically connected to the string select pad 150SP through the second pad contact plug C2, the first pad line L1, and the first pad contact plug C1, which first pad line L1 and the first pad contact plug C1 are connected to the second pad contact plug C2. The first pad lines L1, the second pad contact plug C2, and the second pad line L2 each may include a conductive material. In some embodiments, the first pad lines L1, the second pad contact plug C2, and the second pad line L2 may the same conductive material.

Figure 11:
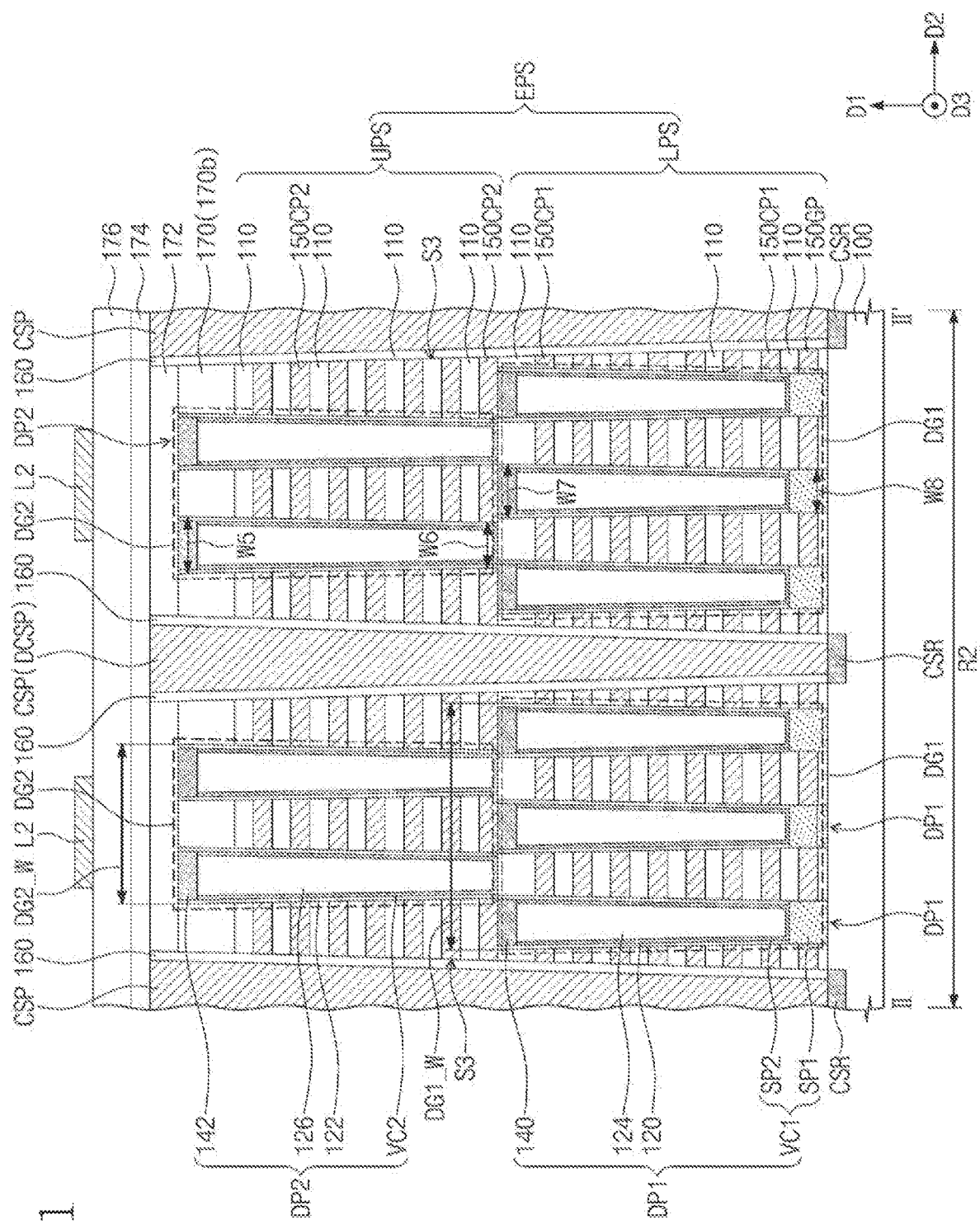
FIG. 11 illustrates a cross-sectional view taken along line II-II' of FIG. 7, partially showing a three-dimensional semiconductor memory device according to some embodiments of inventive concepts.

FIG. 11 illustrates a cross-sectional view taken along line II-II' of FIG. 7, partially showing a three-dimensional semiconductor memory device according to some embodiments of inventive concepts. The same technical features as those of the three-dimensional semiconductor memory device discussed with reference to FIGS. 1 to 9, 10A, and 10B may be briefly discussed or omitted for brevity of description.

Referring to FIG. 11, the number of the upper dummy pillars DP2 in the upper dummy group DG2 may be different from the number of the lower dummy pillars DP1 in the lower dummy group DG1. For example, the number of the lower dummy pillars DP1 in the lower dummy group DG1 may be greater than the number of the upper dummy pillars DP2 in the upper dummy group DG2. In this case, the width DG1_W of the lower dummy group DG1 may be greater than the width DG2_W of the upper dummy group DG2. The upper width W7 of each of the lower dummy pillars DP1 may be greater than the upper width W5 of each of the upper dummy pillars DP2, but inventive concepts are not limited thereto. Except for mentioned above, a three-dimensional semiconductor memory device according to the present inventive concept may be substantially the same as the three-dimensional semiconductor memory devices discussed with reference to FIGS. 1 to 9, 10A, and 10B.

FIGS. 12A, 13A, 14A, 15A, and 16A illustrate cross-sectional views taken along line I-I' of FIG. 2, showing a method of fabricating a three-dimensional semiconductor memory device according to some embodiments of inventive concepts. FIGS. 12B to 16B illustrate cross-sectional views taken along line II-II' of FIG. 7, showing a method of fabricating a three-dimensional semiconductor memory device according to some embodiments of inventive concepts. FIGS. 12C to 16C illustrate cross-sectional views taken along line III-III' of FIG. 7, showing a method of fabricating a three-dimensional semiconductor memory device according to some embodiments of inventive concepts. The same technical features as those of the three-dimensional semiconductor memory devices discussed with reference to FIGS. 1 to 11 may be briefly discussed or omitted for brevity of description.

Figure 12B:
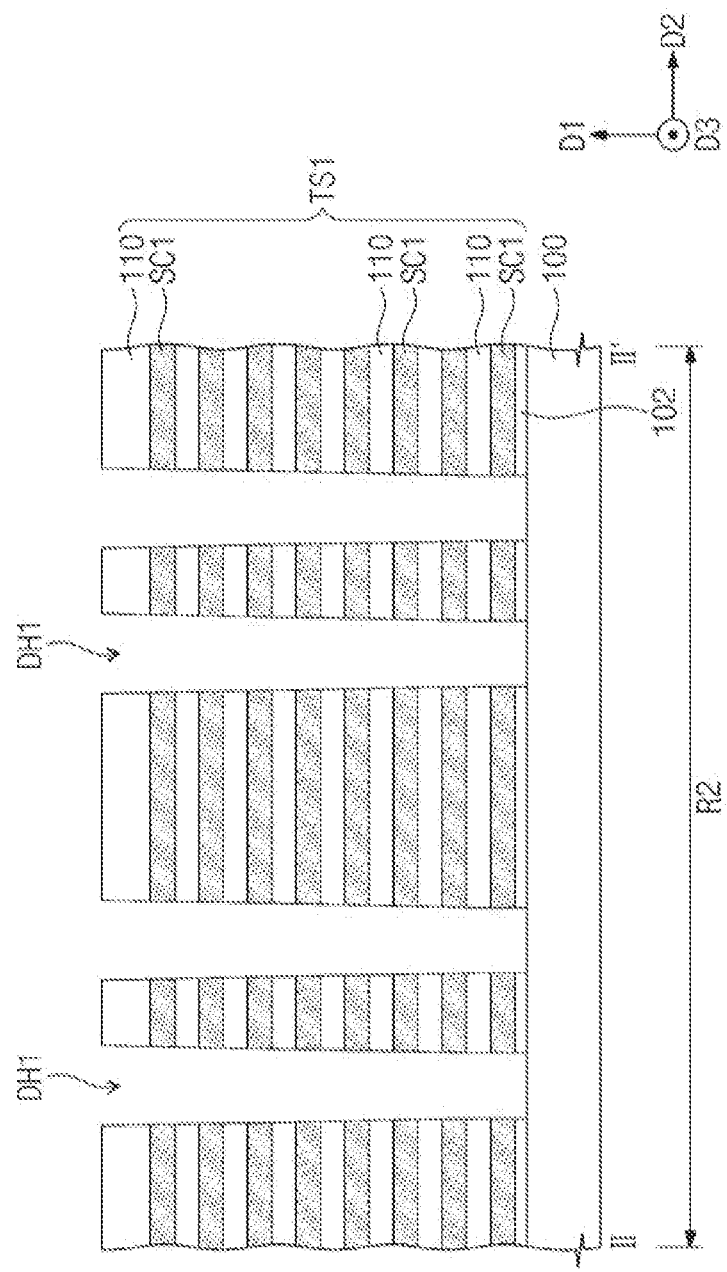
FIGS. 12B, 13B, 14B, 15B, and 16B illustrate cross-sectional views taken along line II-II' of FIG. 7, showing a method of fabricating a three-dimensional semiconductor memory device according to some embodiments of inventive concepts.
Figure 12C:
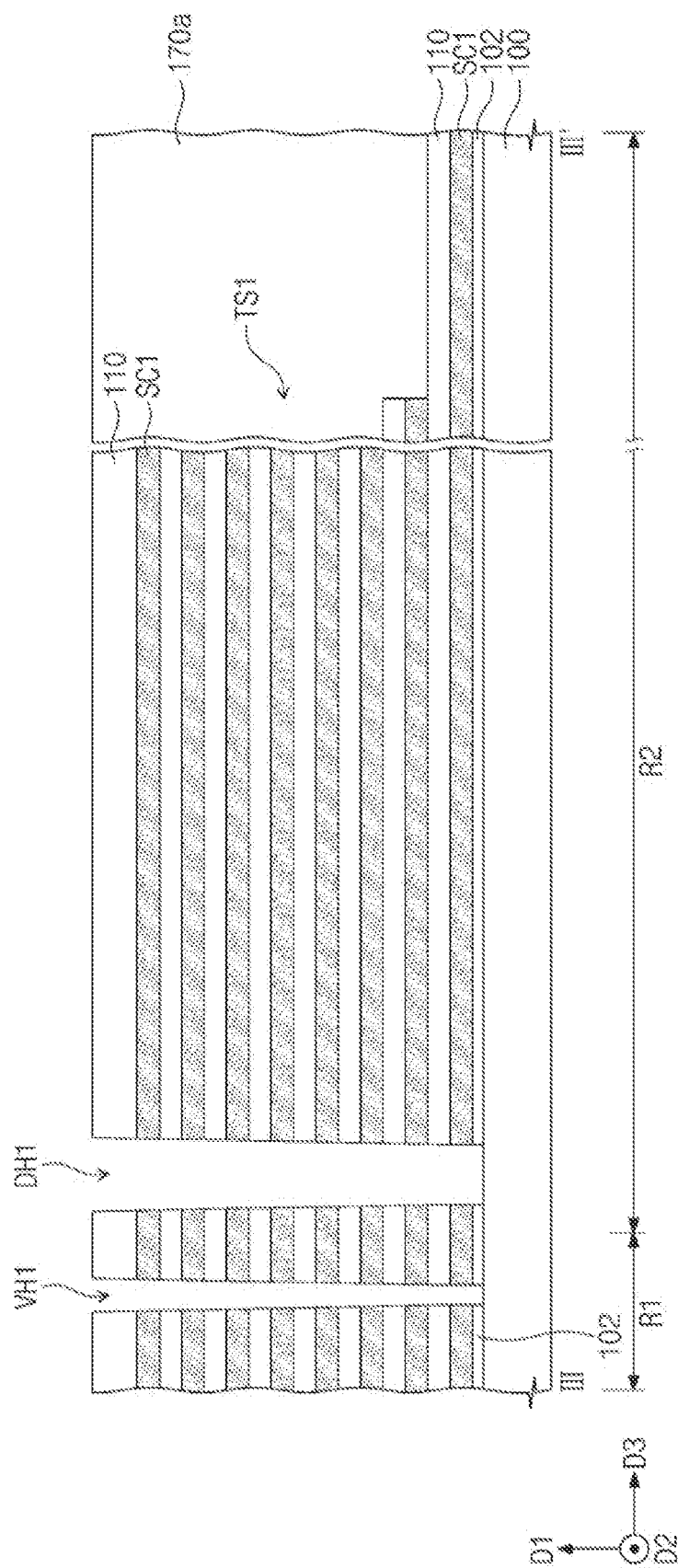

Referring to FIGS. 12A to 12C, a buffer insulating layer 102 may be formed on a surface (e.g., an entire surface) of a substrate 100 including a first region R1 and a second region R2. A lower thin-layer structure TS1 may be formed on the buffer insulating layer 102. The lower thin-layer structure TS1 may include lower sacrificial layers SC1 and insulating layers 110 that are alternately stacked on the buffer insulating layer 102. The lower sacrificial layers SC1 may be formed of a material having an etch selectivity to the buffer insulating layer 102 and the insulating layers 110. For example, the buffer insulating layer 102 and the insulating layers 110 may be formed of silicon oxide layers, and the lower sacrificial layers SC1 may be formed of silicon nitride layers. The insulating layers 110 and the lower sacrificial layers SC1 may be patterned on the second region R2 of the substrate 100, and thus the lower thin-layer structure TS1 may have a stepwise structure at an end thereof. For example, a mask pattern (not shown) may be formed on an uppermost insulating layer 110 of the lower thin-layer structure TS1, and the mask pattern may be used as an etching mask to etch the uppermost insulating layer 110 and an uppermost lower sacrificial layer SC1 to expose a next uppermost insulating layer 110 on the second region R2. After that, the mask pattern may be etched to reduce a width thereof. The etched mask pattern may be used as an etching mask to etch the next uppermost insulating layer 110 and a next uppermost lower sacrificial layer SC1. When the insulating layers 110 and the lower sacrificial layers SC1 are repeatedly etched, and when the mask pattern is repeatedly etched, the lower thin-layer structure TS1 may have the stepwise structure at its end on the second region R2. A first sub-capping insulating layer 170a may be formed on the substrate 100, and may cover the stepwise end of the lower thin-layer structure TS1. The formation of the first sub-capping insulating layer 170a may include forming an insulating layer on the entire surface of the substrate 100 and then performing a planarization process on the insulating layer until a top surface of the lower thin-layer structure TS1 is exposed.

Lower vertical holes VH1 may be formed on the first region R1 of the substrate 100. The substrate 100 may be exposed to each of the lower vertical holes VH1 that penetrate the lower thin-layer structure TS1 and the buffer insulating layer 102. The formation of the lower vertical holes VH1 may include successively patterning the insulating layers 110, the lower sacrificial layers SC1, and the buffer insulating layer 102 that are formed on the first region R1. Lower dummy holes DH1 may be formed on the second region R2 of the substrate 100. The substrate 100 may be exposed to each of the lower dummy holes DH1 that penetrate the lower thin-layer structure TS1 and the buffer insulating layer 102. The formation of the lower dummy holes DH1 may include successively patterning the insulating layers 110, the lower sacrificial layers SC1, and the buffer insulating layer 102 that are formed on the second region R2. The lower vertical holes VH1 and the lower dummy holes DH1 may be formed at the same time.

Figure 13A:
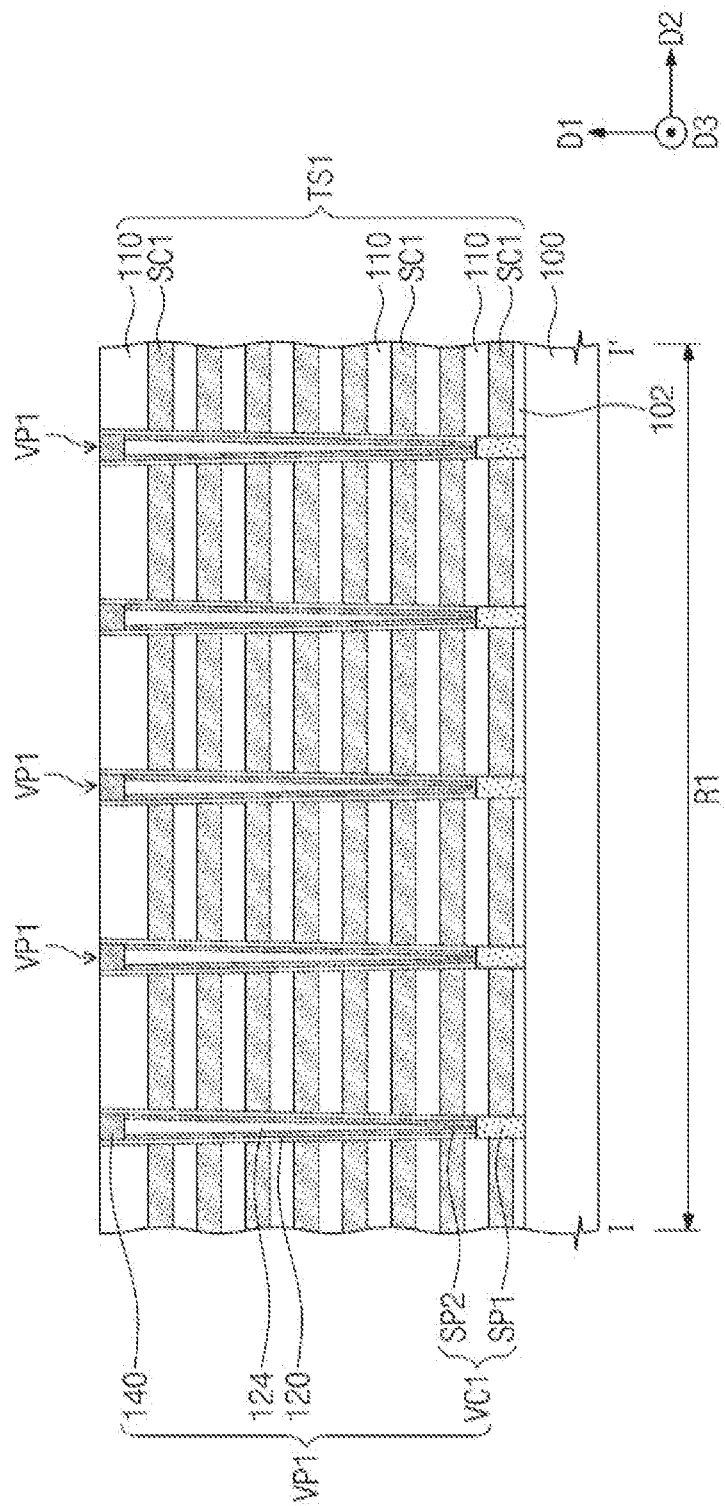
Figure 13B:
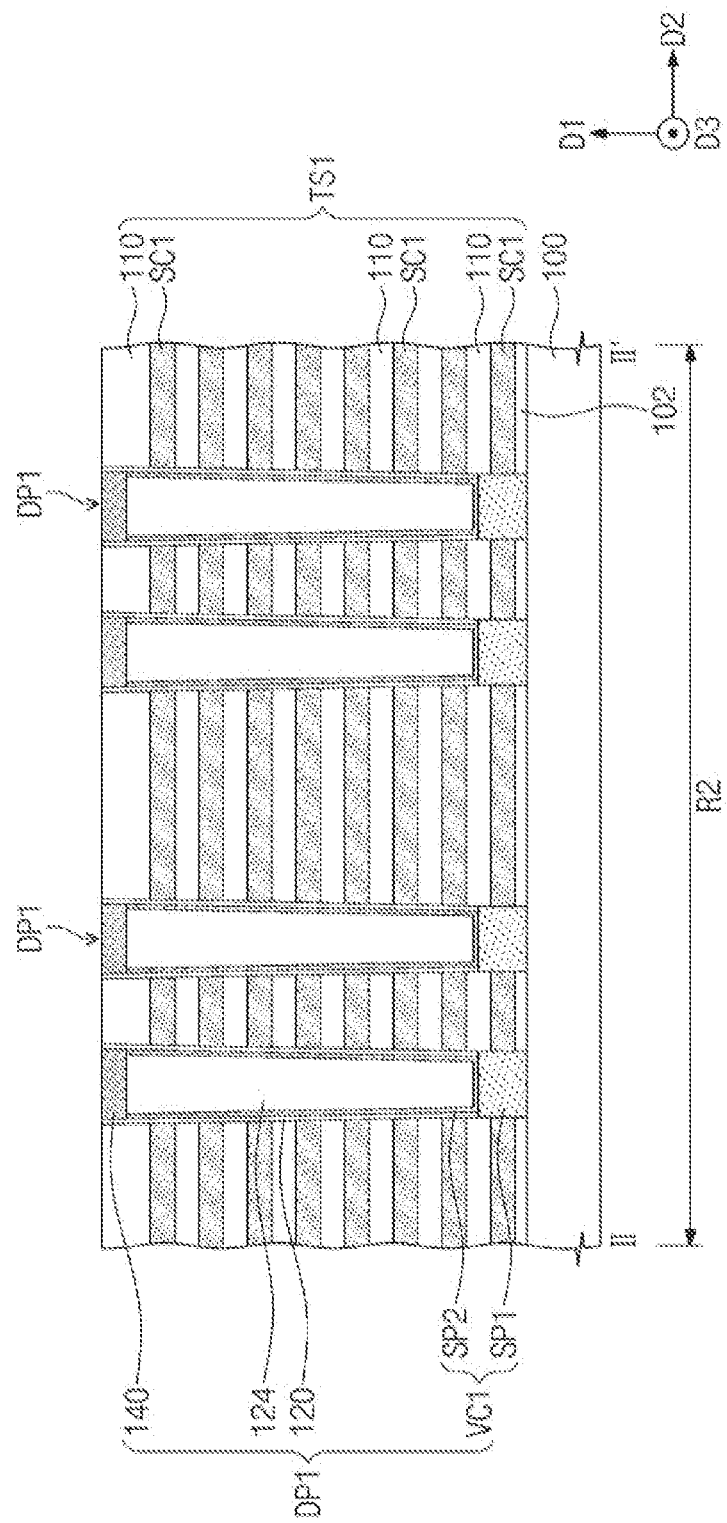
Figure 13C:
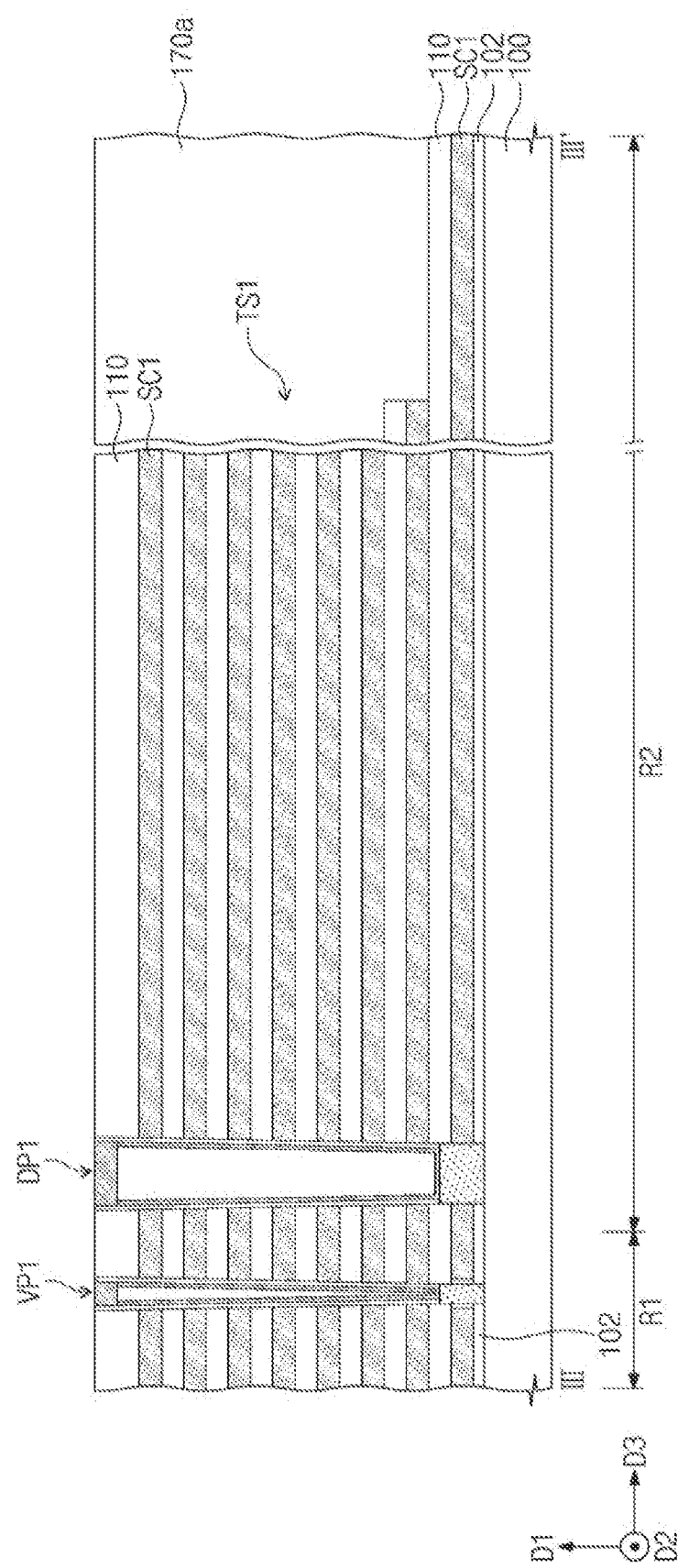

Referring to FIGS. 13A to 13C, lower vertical patterns VP1 may be formed in corresponding lower vertical holes VH1, and lower dummy pillars DP1 may be formed in corresponding lower dummy holes DH1. The lower vertical patterns VP1 and the lower dummy pillars DP1 may be formed at the same time. The lower vertical patterns VP1 and the lower dummy pillars DP1 may be formed identically or similarly to the embodiment shown in FIG. 4 or 6. The lower vertical patterns VP1 may be arranged identically or similarly to that discussed with reference to FIG. 5B, and the lower dummy pillars DP1 may be arranged identically or similarly to that discussed with reference to FIG. 10B.

Figure 14A:
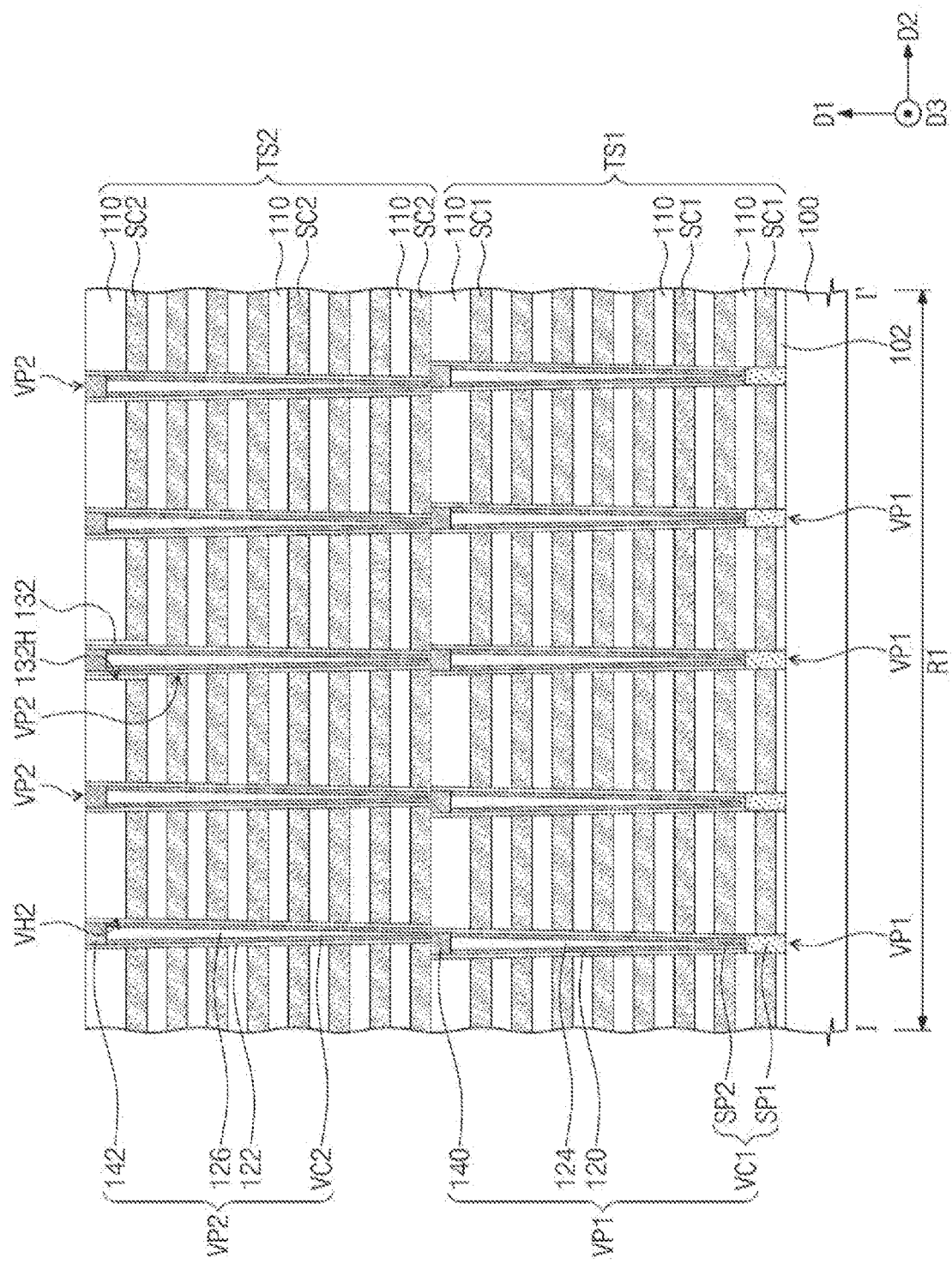
Figure 14B:
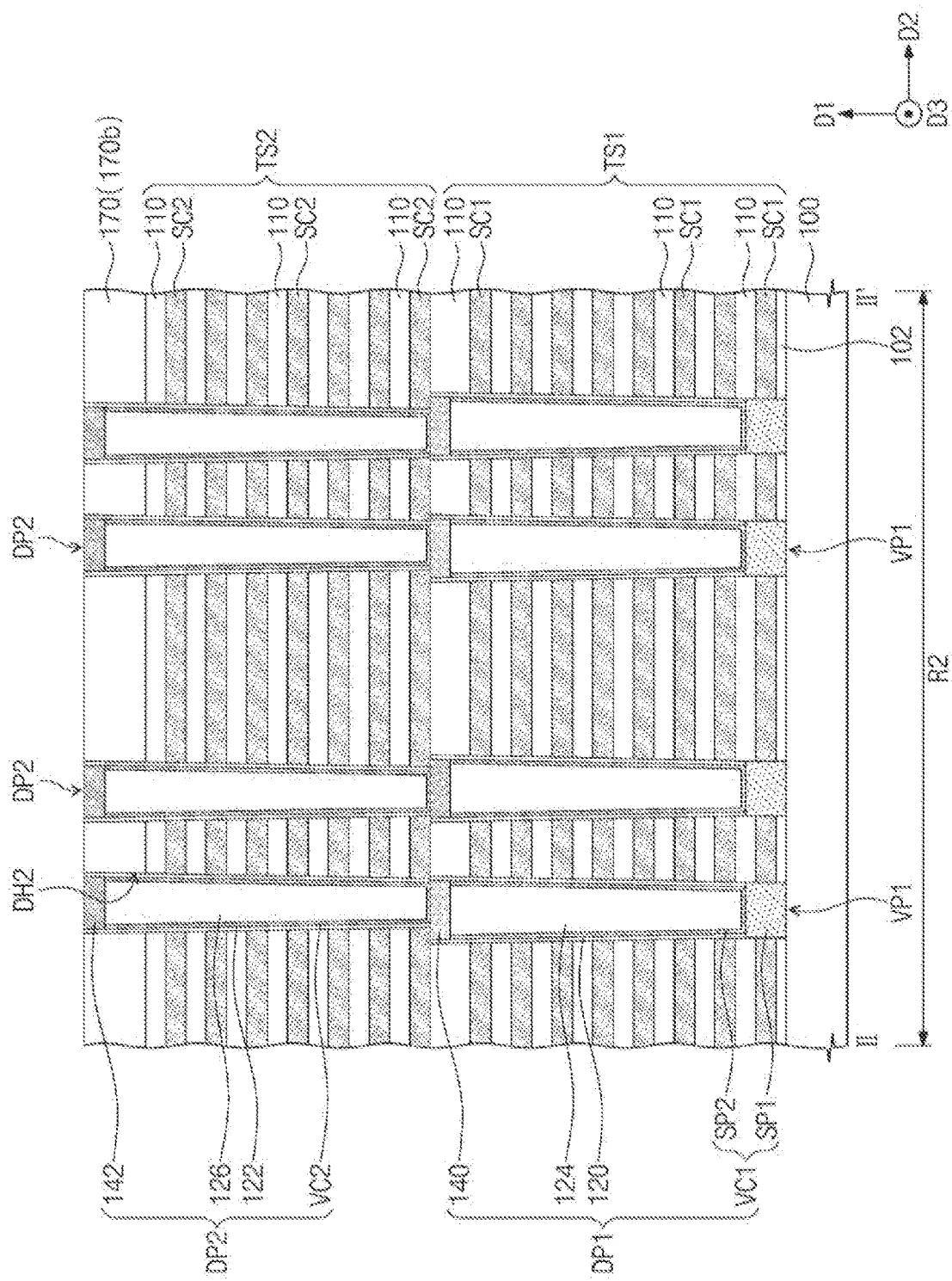
Figure 14C:
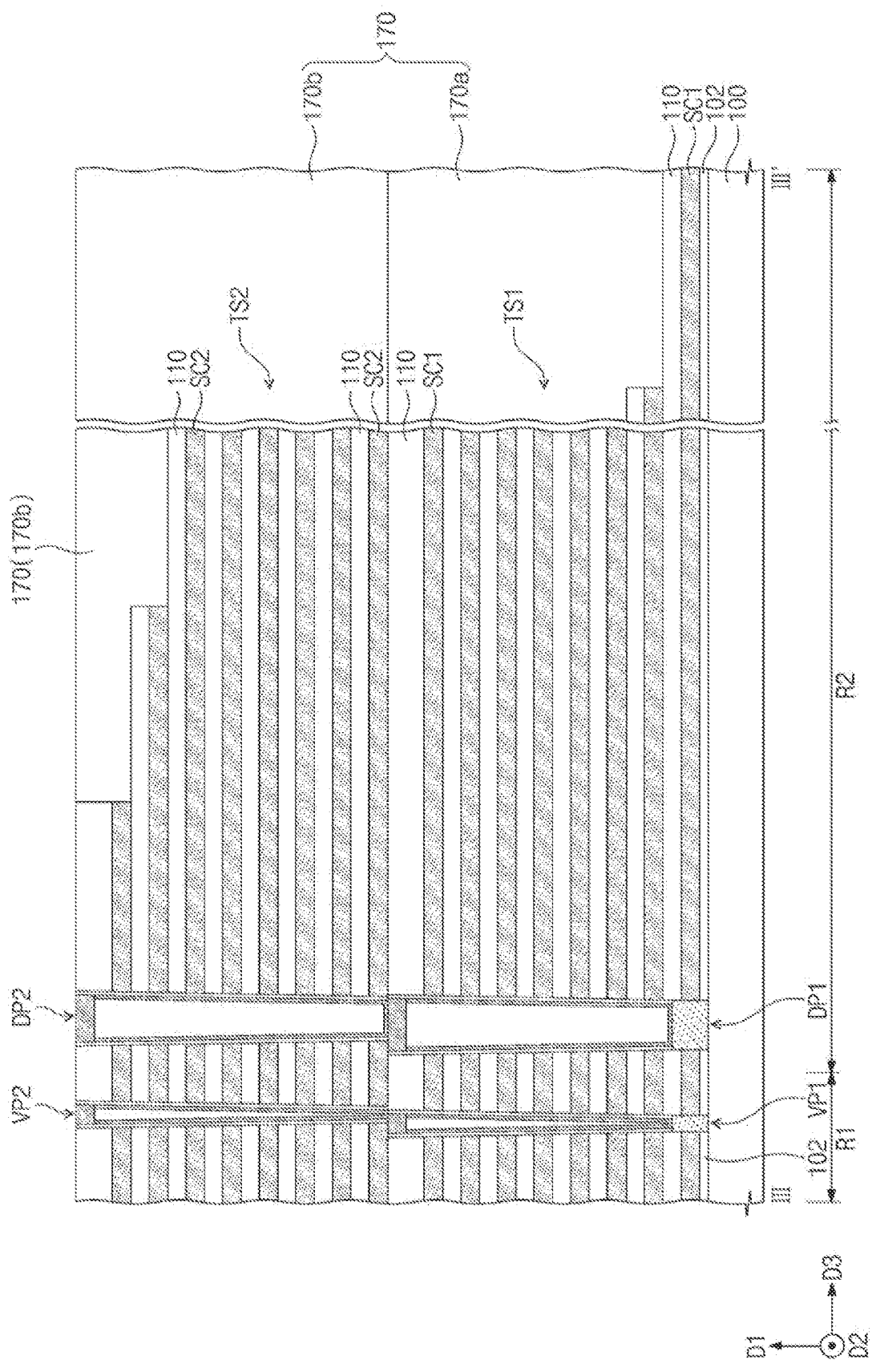

Referring to FIGS. 14A to 14C, an upper thin-layer structure TS2 may be formed on the lower thin-layer structure TS1. The upper thin-layer structure TS2 may include upper sacrificial layers SC2 and insulating layers 110 that are alternately stacked on the lower thin-layer structure TS1. The upper sacrificial layers SC2 may be formed of a material having an etch selectivity to the buffer insulating layer 102 and the insulating layers 110. For example, the buffer insulating layer 102 and the insulating layers 110 may be formed of silicon oxide layers, and the upper sacrificial layers SC2 may be formed of silicon nitride layers. The insulating layers 110 and the upper sacrificial layers SC2 may be patterned on the second region R2 of the substrate 100, and thus the upper thin-layer structure TS2 may have a stepwise structure at an end thereof. The stepwise end of the upper thin-layer structure TS2 may be formed by, for example, substantially the same method as that used to form the stepwise end of the lower thin-layer structure TS1. A second sub-capping insulating layer 170b may be formed on the substrate 100, and may cover the stepwise end of the upper thin-layer structure TS2. The formation of the second sub-capping insulating layer 170b may include forming an insulating layer on the entire surface of the substrate 100 and then performing a planarization process on the insulating layer until a top surface of the upper thin-layer structure TS2 is exposed. The first and second sub-capping insulating layers 170a and 170b may be defined as a lower capping insulating layer 170.

An uppermost insulating layer 110 and an uppermost upper sacrificial layer SC2 of the upper thin-layer structure TS2 may be patterned to form a cutting region 132H. The cutting region 132H may extend from the first region R1 toward the second region R2. A separation insulting pattern 132 may be formed in the cutting region 132H.

Upper vertical holes VH2 may be formed on the first region R1 of the substrate 100. Each of the upper vertical holes VH2 may penetrate the upper thin-layer structure TS2. The upper vertical holes VH2 may correspondingly expose top surfaces of the lower vertical patterns VP1. The formation of the upper vertical holes VH2 may include successively patterning the insulating layers 110 and the upper sacrificial layers SC2 that are formed on the first region R1. Upper dummy holes DH2 may be formed on the second region R2 of the substrate 100. Each of the upper dummy holes DH2 may penetrate the upper thin-layer structure TS2. The upper dummy holes DH2 may correspondingly expose top surfaces of the lower dummy pillars DP1, but inventive concepts are not limited thereto. Each of the upper dummy holes DH2 may be formed to expose the top surface of the lower thin-layer structure TS1. The formation of the upper dummy holes DH2 may include successively patterning the insulating layers 110 and the upper sacrificial layers SC2 that are formed on the second region R2. The upper vertical holes VH2 and the upper dummy holes DH2 may be formed at the same time.

Upper vertical patterns VP2 may be formed in corresponding upper vertical holes VH2, and upper dummy pillars DP2 may be formed in corresponding upper dummy holes DH2. The upper vertical patterns VP2 and the upper dummy pillars DP2 may be formed at the same time. The upper vertical patterns VP2 and the upper dummy pillars DP2 may be formed identically or similarly to the embodiment shown in FIG. 6. The upper vertical patterns VP2 may be arranged identically or similarly to that discussed with reference to FIG. 5A, and the upper dummy pillars DP2 may be arranged identically or similarly to that discussed with reference to FIG. 10A.

Figure 15A:
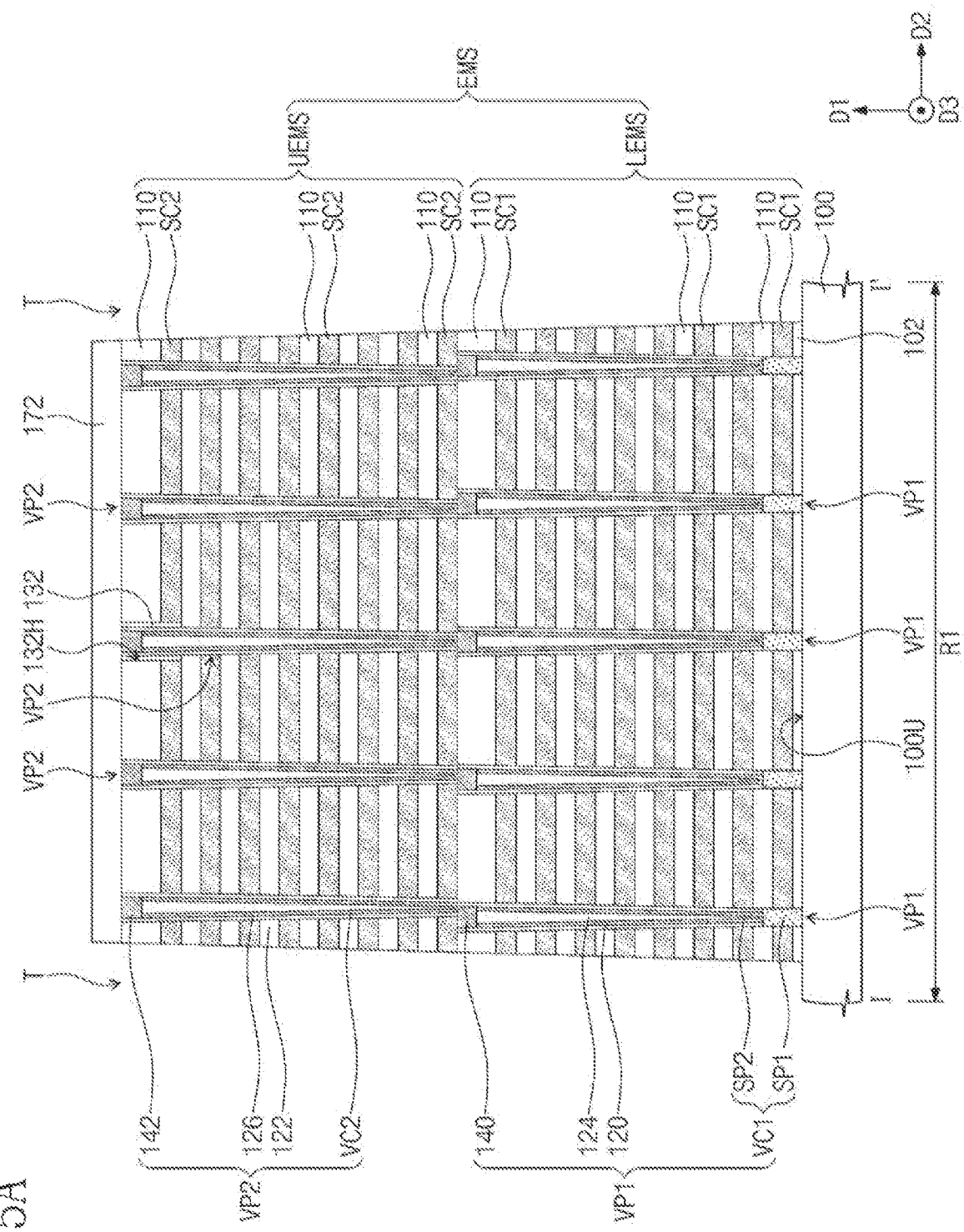
Figure 15B:
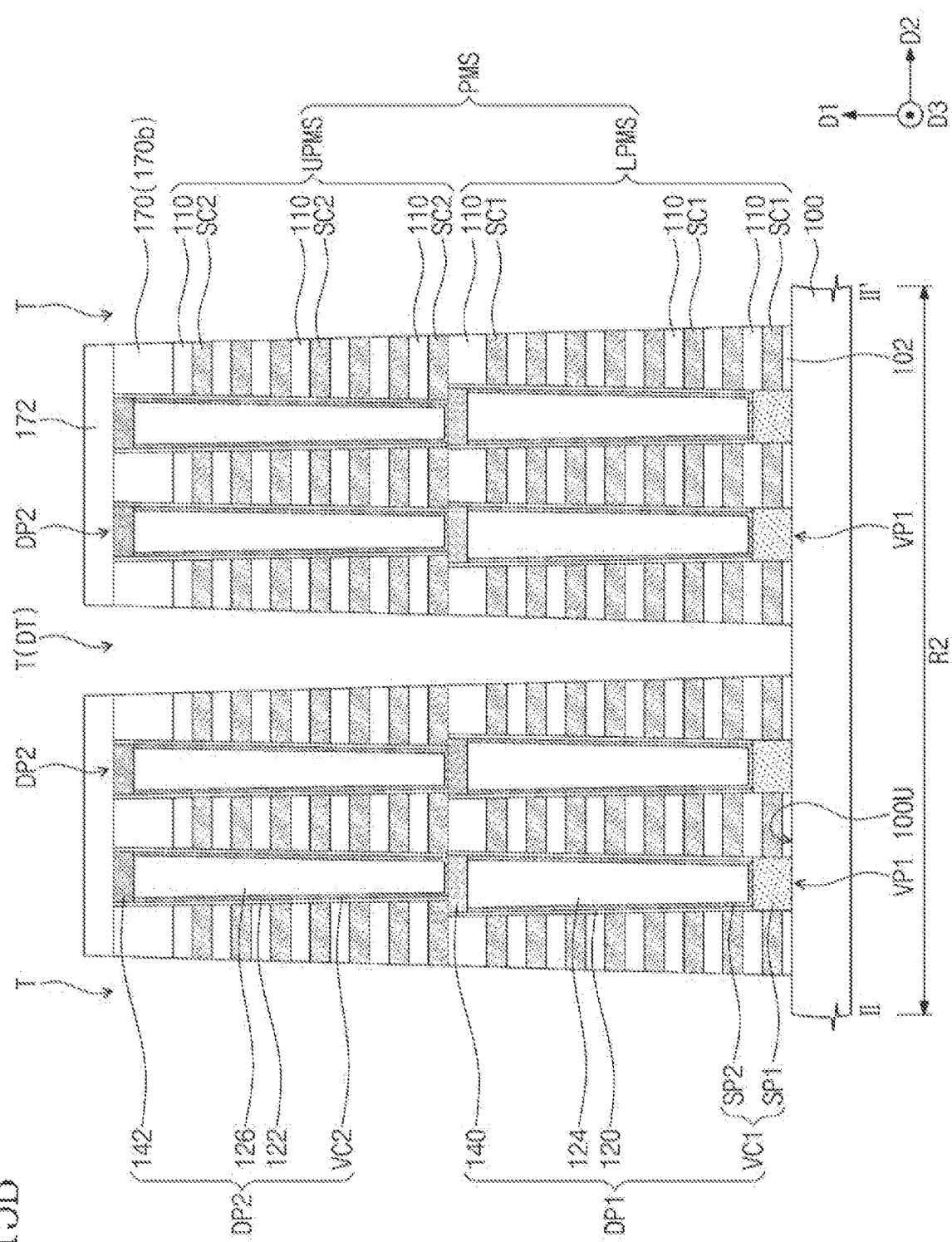
Figure 15C:
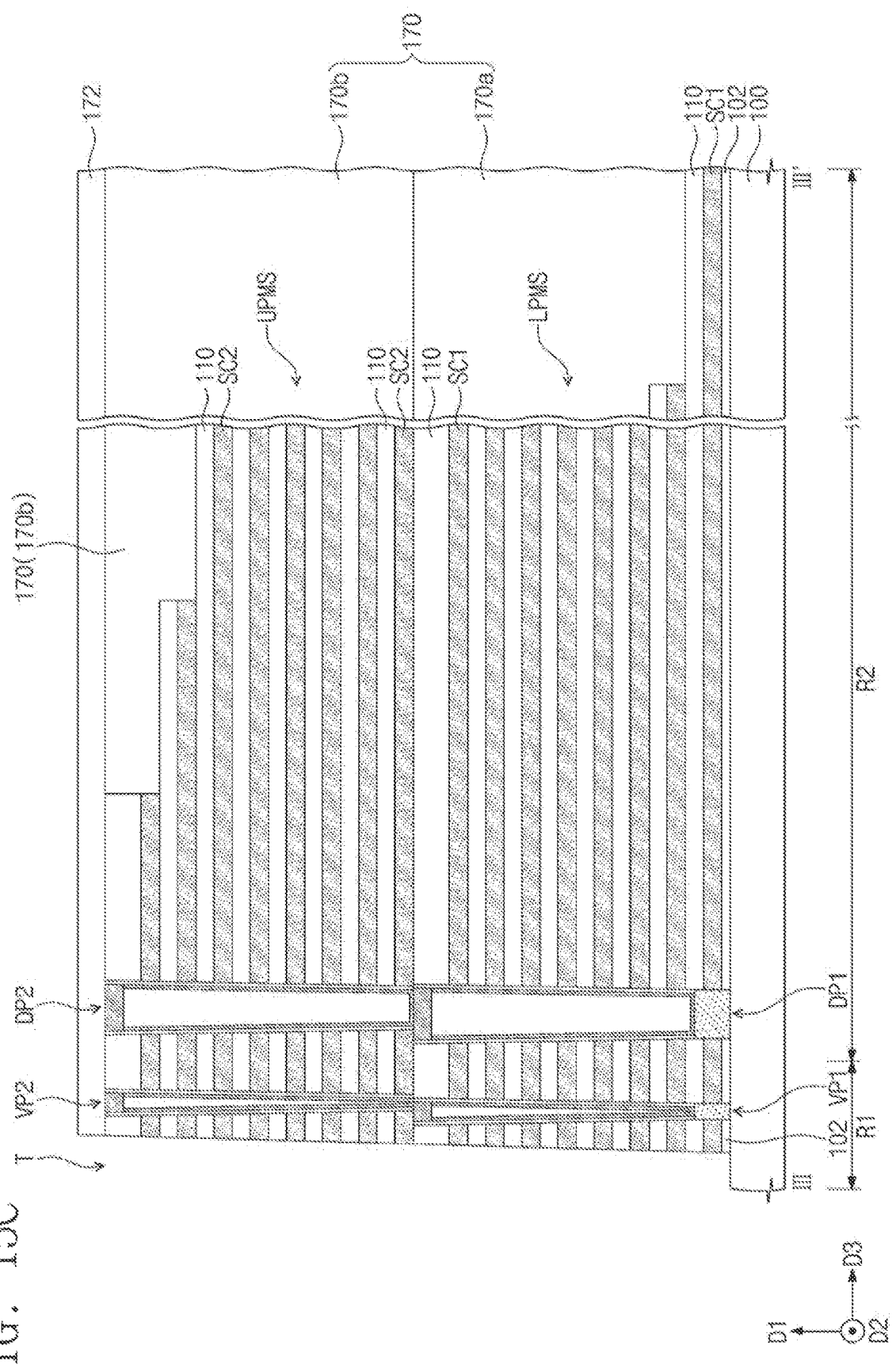

Referring to FIGS. 15A to 15C, an upper capping insulating layer 172 may be formed on the upper thin-layer structure TS2. The upper capping insulating layer 172 may extend onto the second region R2 of the substrate 100, and may cover the lower capping insulating layer 170.

The upper capping insulating layer 172, the upper thin-layer structure TS2, the lower thin-layer structure TS1, and the buffer insulating layer 102 may be successively patterned to form trenches T exposing the substrate 100. The trenches T may include a pair of trenches T extending from the first region R1 of the substrate 100 toward the second region R2 of the substrate 100, and also include a dummy trench DT formed on the second region R2 of the substrate 100. The dummy trench DT may be formed between the pair of trenches T.

The pair of trenches T may form an electrode mold structure EMS on the first region R1 of the substrate 100. The electrode mold structure EMS may include a lower electrode mold structure LEMS including the lower sacrificial layers SC1 and the insulating layers 110 between the lower sacrificial layers SC1, and also include an upper electrode mold structure UEMS including the upper sacrificial layers SC2 and the insulating layers 110 between the upper sacrificial layers SC2. The lower vertical patterns VP1 may penetrate the lower electrode mold structure LEMS, and the upper vertical patterns VP2 may penetrate the upper electrode mold structure UEMS. The electrode mold structure EMS may have side surfaces exposed to the pair of trenches T. The pair of trenches T may be formed to have a relatively large aspect ratio. In this case, each of the pair of trenches T may be formed to have an upper width and a lower width less than the upper width, and thus, the side surfaces of the electrode mold structure EMS may be sloped relative to a top surface 100U of the substrate 100 such that the electrode mold structure EMS may have a smaller width at a top end thereof and a larger width at a bottom end thereof.

The trenches T may form a pair of pad mold structures PMS on the second region R2 of the substrate 100. Each of the pad mold structures PMS may be formed by the dummy trench DT and one of the pair of trenches T. Each of the pad mold structures PMS may include a lower pad mold structure LPMS including the lower sacrificial layers SC1 and the insulating layers 110 between the lower sacrificial layers SC1, and also include an upper pad mold structure UPMS including the upper sacrificial layers SC2 and the insulating layers 110 between the upper sacrificial layers SC2. The lower dummy pillars DP1 may penetrate the lower pad mold structure LPMS, and the upper dummy pillars DP2 may penetrate the upper pad mold structure UPMS. Each of the pad mold structures PMS may have side surfaces exposed to the dummy trench DT and one of the pair of trenches T. The pair of trenches T and the dummy trench DT may be formed to have a relatively large aspect ratio. In this case, each of the pair of trenches T and the dummy trench DT may be formed to have an upper width (e.g., a width of an upper portion) and a lower width (e.g., a width of a lower portion) less than the upper width, and thus, the side surfaces of each of the pad mold structures EMS may be sloped relative to the top surface 100U of the substrate 100 such that each of the electrode mold structures EMS may have a smaller width at a top end thereof and a larger width at a bottom end thereof.

Figure 16A:
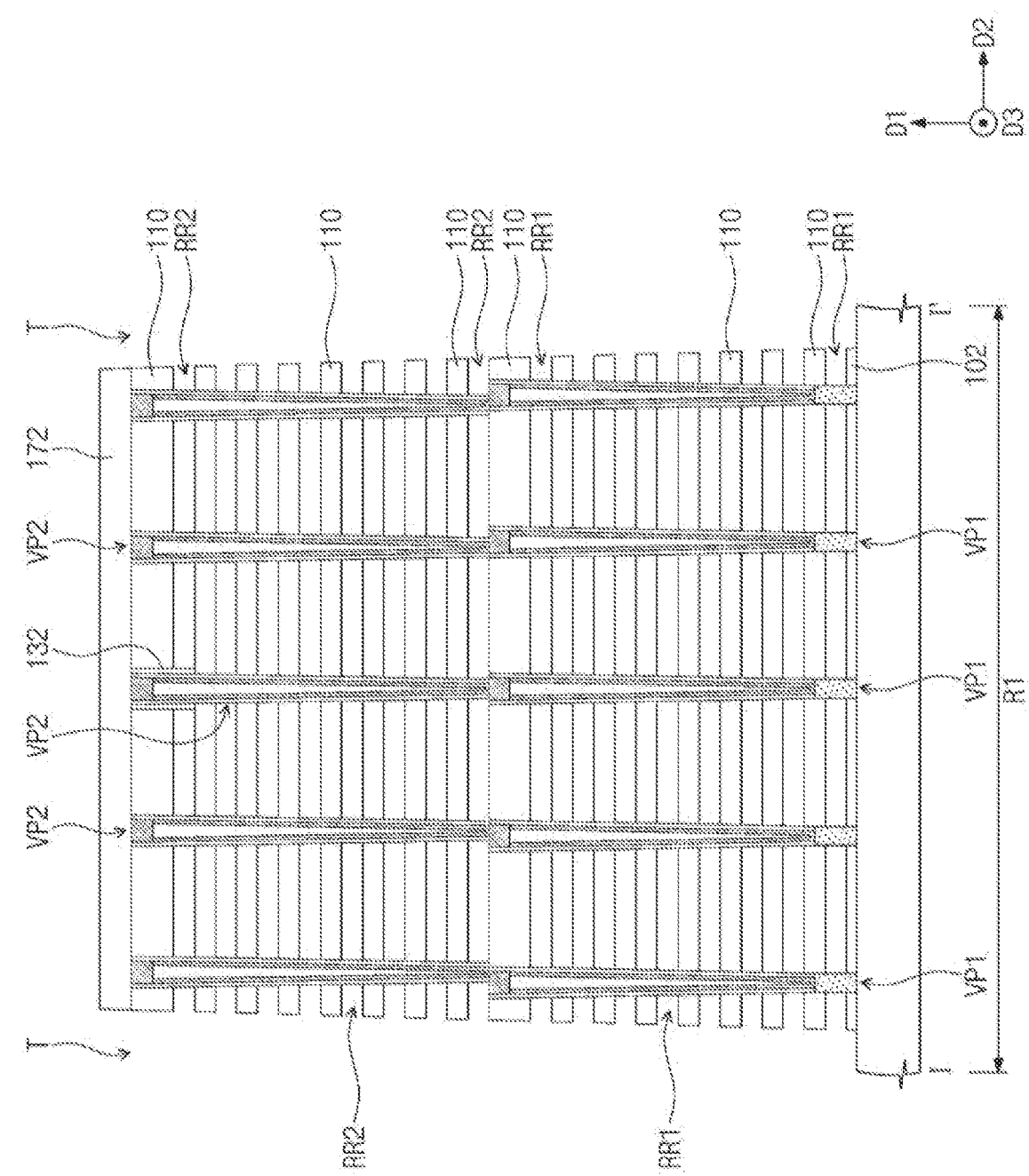
Figure 16B:
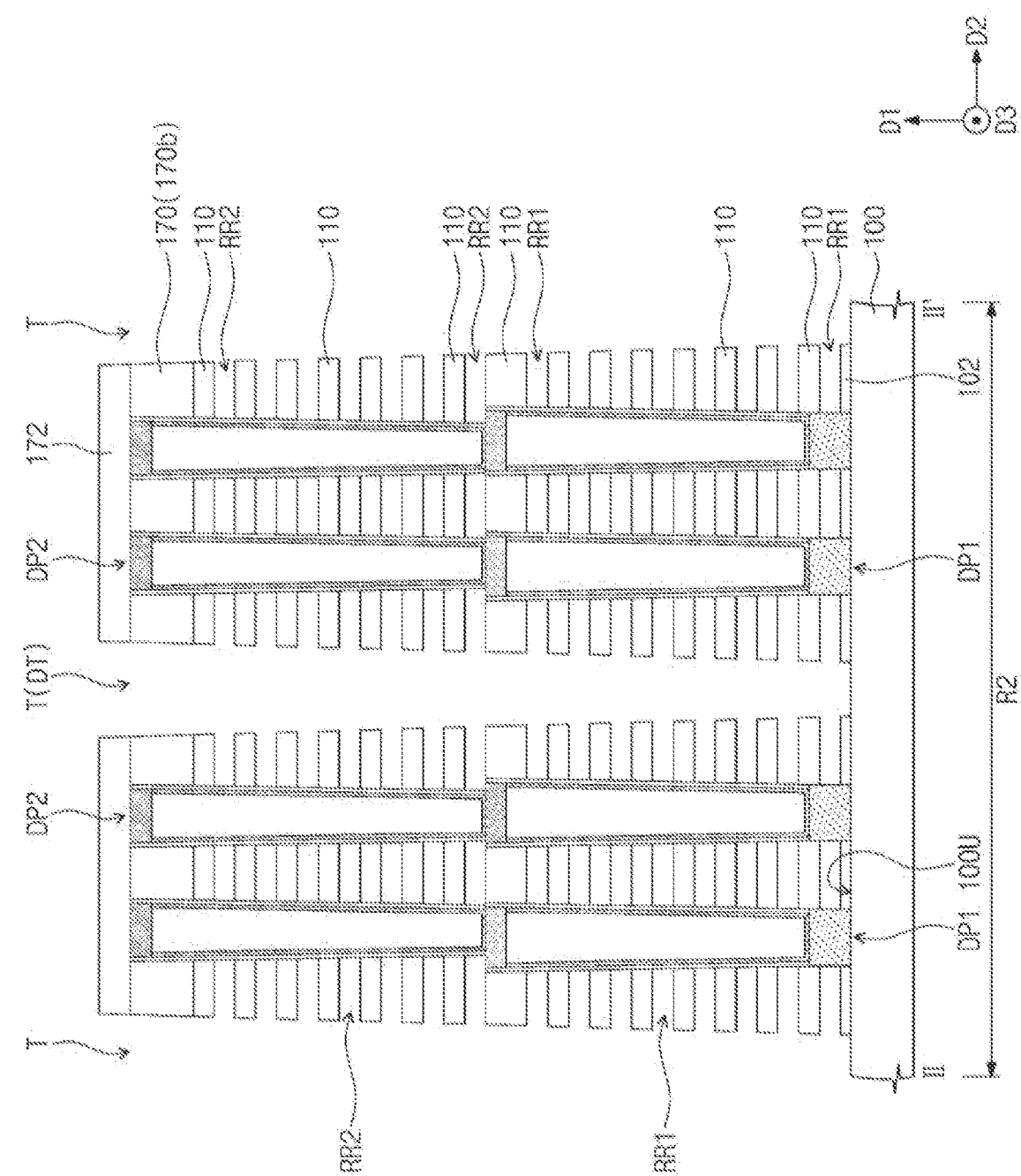

Referring to FIGS. 16A to 16C, the lower and upper sacrificial layers SC1 and SC2 exposed to the trench T may be removed to form empty regions (e.g., openings) RR1 and RR2 between the insulating layers 110. The empty regions RR1 and RR2 may include lower empty regions RR1 formed when the lower sacrificial layers SC1 are removed, and also include upper empty regions RR2 formed when the upper sacrificial layers SC2 are removed. The empty regions RR1 and RR2 may extend from the trenches T into gaps between the insulating layers 110 along a direction parallel to the top surface 100U of the substrate 100. The lower and upper sacrificial layers SC1 and SC2 may be removed by an isotropic etching process (e.g., a wet etching process). When the lower and upper sacrificial layers SC1 and SC2 are removed, the lower and upper vertical patterns VP1 and VP2 may support the insulating layers 110 on the first region R1, and the lower and upper dummy pillars DP1 and DP2 may support the insulating layers 110 on the second region R2.

According to inventive concepts, the side surfaces of the electrode mold structure EMS may be sloped relative to the top surface 100U of the substrate 100 such that the electrode mold structure EMS may have a smaller width at its top end and a larger width at its bottom end, and the lower vertical patterns VP1 may have a pitch greater than that of the upper vertical patterns VP2. In addition, the side surfaces of each of the pad mold structures PMS may be sloped relative to the top surface 100U of the substrate 100 such that each of the pad mold structures PMS may have a smaller width at its top end and a larger width at its bottom end, and the lower dummy pillars DP1 may have a pitch greater than that of the upper dummy pillars DP2. In this case, when the lower and upper sacrificial layers SC1 and SC2 are removed, the lower vertical patterns VP1 and the lower dummy pillars DP1 may stably support the insulating layers 110. Moreover, since the lower vertical patterns VP1 and the lower dummy pillars DP1 are formed to have a relatively large pitch, it may be possible to increase a process margin for forming the lower vertical patterns VP1 and the lower dummy pillars DP1.

Referring again to FIGS. 3, 8, and 9, a first conductive layer may be formed on the substrate 100, thereby filling the trenches T and the empty regions RR1 and RR2. The first conductive layer may include a barrier layer conformally covering inner sidewalls of the trenches T and of the empty regions RR1 and RR2, and also include an electrode layer filling remaining portions of the trenches T and of the empty regions RR1 and RR2. After that, the first conductive layer in the trenches T may be removed to form gate electrodes 150G, 150C1, 150C2, and 150S and electrode pads 150GP, 150CP1, 150CP2, and 150SP in the empty regions RR1 and RR2. Thus, there may be formed the electrode structure ES discussed with reference to FIGS. 1 to 6 and the pad structures EPS discussed with reference to FIGS. 7 to 11.

Dopant ions may be implanted into the substrate 100 exposed to the trenches T, forming common source regions CSR. Common source plugs CSP may be formed in corresponding trenches T to come into connection with corresponding common source regions CSR. Side insulating spacers 160 may be formed on inner surfaces of the trenches T. The formation of the side insulating spacers 160 may include forming an insulating spacer layer to conformally cover top surfaces of the common source regions CSR and the inner surfaces of the trenches T, and then performing an anisotropic etching process on the insulating spacer layer. The anisotropic etching process may expose the common source regions CSR. The formation of the common source plugs CSP may include forming a second conductive layer to fill (e.g., partially fill, completely fill) remaining portions of the trenches T after the side insulating spacers 160 are formed, and then performing a planarization process to planarize the second conductive layer until the upper capping insulating layer 172 is exposed. The planarization process may form the common source plugs CSP locally in the trenches T.

First contacts 164 may be formed on the first region R1 of the substrate 100. The first contacts 164 may penetrate the upper capping insulating layer 172 to come into connection with corresponding upper vertical patterns VP2. A first interlayer dielectric layer 174 may be formed on the upper capping insulating layer 172, covering the first and second regions R1 and R2 of the substrate 100. Second contacts 166 may be formed on the first region R1 of the substrate 100. Second contacts 166 may penetrate the first interlayer dielectric layer 174 to come into connection with corresponding first contacts 164. First pad contact plugs C1 may be formed on the second region R2 of the substrate 100. The first pad contact plugs C1 may penetrate the first interlayer dielectric layer 174 and the upper capping insulating layer 172, and thus may be correspondingly connected to the electrode pads 150GP, 150CP1, 150CP2, and 150SP. Ones of the first pad contact plugs C1 may penetrate the lower capping insulating layer 170 to come into connection with corresponding ones of the electrode pads 150GP, 150CP1, 150CP2, and 150SP. Bit lines BL may be formed on the first interlayer dielectric layer 174 on the first region R1 of the substrate 100, and first pad lines L1 may be formed on the first interlayer dielectric layer 174 on the second region R2 of the substrate 100. Each of the bit lines BL may be connected to a corresponding one of the upper vertical patterns VP2 through a corresponding one of the second contacts 166 and a corresponding one of the first contacts 164. Each of the first pad lines L1 may be connected to a corresponding one of the electrode pads 150GP, 150CP1, 150CP2, and 150SP through a corresponding one of the first pad contact plugs C1. A second interlayer dielectric layer 176 may be formed on the first interlayer dielectric layer 174, covering the bit lines BL and the first pad lines L1. A second pad contact plug C2 may be formed to penetrate the second interlayer dielectric layer 176 to come into connection with a corresponding one of the first pad lines L1. A second pad line L2 may be formed on the second interlayer dielectric layer 176, and connected through the second pad contact plug C2 to the string select pad 150SP.

According to inventive concepts, it may be possible to provide a three-dimensional semiconductor memory device having improved integration and structural stability.

The aforementioned description provides some embodiments for explaining inventive concepts, and thus the description should be considered illustrative, and not restrictive. Therefore, inventive concepts are not limited to the embodiments described above, and it will be understood by one of ordinary skill in the art that variations in form and detail may be made therein without departing from the spirit and essential features of inventive concepts. To the maximum extent allowed by law, the scope is to be determined by the broadest permissible interpretation of the following claims and their equivalents, and shall not be restricted or limited by the foregoing detailed description.

What is claimed is:

1. A three-dimensional semiconductor memory device comprising:
    an electrode structure including a plurality of gate electrodes stacked in a first direction that is perpendicular to a top surface of a substrate;
    a lower pattern group including a plurality of lower vertical patterns that are in a lower portion of the electrode structure and are connected to the substrate; and
    an upper pattern group including a plurality of upper vertical patterns that are in an upper portion of the electrode structure,
    wherein the plurality of upper vertical patterns are connected to the plurality of lower vertical patterns, respectively,
    wherein a first upper vertical pattern of the plurality of upper vertical patterns is connected to a first lower vertical pattern of the plurality of lower vertical patterns, a center of a bottom surface of the first upper vertical pattern is offset in a second direction from a center of a top surface of the first lower vertical pattern, and the second direction is parallel to the top surface of the substrate, and
    wherein a second upper vertical pattern of the plurality of upper vertical patterns is connected to a second lower vertical pattern of the plurality of lower vertical patterns, and a center of a bottom surface of the second upper vertical pattern is offset in an opposite direction of the second direction from a center of a top surface of the second lower vertical pattern.

2. The three-dimensional semiconductor memory device of claim 1, further comprising two common source plugs spaced apart from each other in the second direction, wherein the electrode structure is between the two common source plugs.

3. The three-dimensional semiconductor memory device of claim 2, wherein the first upper vertical pattern and the first lower vertical pattern are adjacent to a first one of the two common source plugs, and the second upper vertical pattern and the second lower vertical pattern are adjacent to a second one of the two common source plugs.

4. The three-dimensional semiconductor memory device of claim 1, wherein the plurality of upper vertical patterns include a dummy upper vertical pattern, and the dummy upper vertical pattern is between the first upper vertical pattern and the second upper vertical pattern.

5. The three-dimensional semiconductor memory device of claim 4, wherein the plurality of lower vertical patterns include a dummy lower vertical pattern, the dummy lower vertical pattern is between the first lower vertical pattern and the second lower vertical pattern, and the dummy upper vertical pattern is connected to the dummy lower vertical pattern.

6. The three-dimensional semiconductor memory device of claim 5, further comprising first and second common source plugs spaced apart from each other in the second direction, wherein the electrode structure is between the first and second common source plugs,
  wherein the first upper vertical pattern is between the first common source plug and the dummy upper vertical pattern, and
  wherein the first lower vertical pattern is between the first common source plug and the dummy lower vertical pattern.

7. The three-dimensional semiconductor memory device of claim 6, wherein the second upper vertical pattern is between the second common source plug and the dummy upper vertical pattern, and
  wherein the second lower vertical pattern is between the second common source plug and the dummy lower vertical pattern.

8. The three-dimensional semiconductor memory device of claim 1, wherein each of the plurality of lower vertical patterns comprises:
  a respective one of a plurality of lower vertical channels, wherein the plurality of lower vertical channels are in the lower portion of the electrode structure and are connected to the substrate; and
  a respective one of a plurality of lower conductive pads, wherein the plurality of lower conductive pads are on the plurality of lower vertical channels, respectively, and
  wherein the plurality of upper vertical patterns are connected to the plurality of lower conductive pads, respectively.

9. The three-dimensional semiconductor memory device of claim 8, wherein each of the plurality of upper vertical patterns comprises:
  a respective one of a plurality of upper vertical channels, wherein the plurality of upper vertical channels are in the upper portion of the electrode structure and are connected to the plurality of lower conductive pads, respectively; and
  a respective one of a plurality of upper conductive pads, wherein the plurality of upper conductive pads are on the plurality of upper vertical channels, respectively.

10. The three-dimensional semiconductor memory device of claim 9, further comprising a plurality of bit lines on the electrode structure, wherein the plurality of bit lines are spaced apart from each other, and
  wherein the plurality of upper vertical patterns are connected to respective ones of the plurality of bit lines through respective ones of the plurality of upper conductive pads.

11. The three-dimensional semiconductor memory device of claim 1, wherein a width of an upper portion of each of the first and second lower vertical patterns is greater than a width of an upper portion of each of the first and second upper vertical patterns.

12. A three-dimensional semiconductor memory device comprising:
  an electrode structure including a plurality of gate electrodes stacked in a first direction that is perpendicular to a top surface of a substrate;
  a lower pattern group including a plurality of lower vertical patterns that are in a lower portion of the electrode structure and are connected to the substrate; and
  an upper pattern group including a plurality of upper vertical patterns that are in an upper portion of the electrode structure,
  wherein the plurality of upper vertical patterns are connected to the plurality of lower vertical patterns, respectively,
  wherein the plurality of upper vertical patterns include a first upper vertical pattern and a second upper vertical pattern that are spaced apart from each other in a second direction parallel to the top surface of the substrate,
  wherein the plurality of lower vertical patterns include a first lower vertical pattern and a second lower vertical pattern that are spaced apart from each other in the second direction,
  wherein the first upper vertical pattern is connected to the first lower vertical pattern, and a center of a bottom surface of the first upper vertical pattern is offset in a third direction parallel to the top surface of the substrate from a center of a top surface of the first lower vertical pattern, and
  wherein the second upper vertical pattern is connected to the second lower vertical pattern, and a center of a bottom surface of the second upper vertical pattern is offset in a fourth direction parallel to the top surface of the substrate from a center of a top surface of the second lower vertical pattern.

13. The three-dimensional semiconductor memory device of claim 12, wherein the third direction is the same as the second direction.

14. The three-dimensional semiconductor memory device of claim 13, wherein the fourth direction is an opposite direction of the second direction.

15. The three-dimensional semiconductor memory device of claim 14, wherein the electrode structure comprises opposing sides that are spaced apart from each other in the second direction, and
  wherein the opposing sides of the electrode structure are sloped relative to the top surface of the substrate, and a width of a top end of the electrode structure is less than a width of a bottom end of the electrode structure.

16. The three-dimensional semiconductor memory device of claim 12, wherein the plurality of upper vertical patterns include a dummy upper vertical pattern, and the dummy upper vertical pattern is between the first upper vertical pattern and the second upper vertical pattern.

17. The three-dimensional semiconductor memory device of claim 16, wherein the plurality of lower vertical patterns include a dummy lower vertical pattern, the dummy lower vertical pattern is between the first lower vertical pattern and the second lower vertical pattern, and the dummy upper vertical pattern is connected to the dummy lower vertical pattern.

18. The three-dimensional semiconductor memory device of claim 17, further comprising first and second common source plugs spaced apart from each other in the second direction, wherein the electrode structure is between the first and second common source plugs,
  wherein the first upper vertical pattern is between the first common source plug and the dummy upper vertical pattern, and
  wherein the first lower vertical pattern is between the first common source plug and the dummy lower vertical pattern.

19. The three-dimensional semiconductor memory device of claim 18, wherein the second upper vertical pattern is between the second common source plug and the dummy upper vertical pattern, and
  wherein the second lower vertical pattern is between the second common source plug and the dummy lower vertical pattern.

20. The three-dimensional semiconductor memory device of claim 19, further comprising two common source regions that are in the substrate and are spaced apart from each other in the second direction, wherein the electrode structure is between the two common source regions, and
    wherein the first and second common source plugs are connected to the two common source regions, respectively.

\* \* \* \* \*